(12) United States Patent
Su et al.

(10) Patent No.: US 10,804,133 B2
(45) Date of Patent: Oct. 13, 2020

(54) ARTICLE TRANSFERRING METHOD IN SEMICONDUCTOR FABRICATION

(71) Applicant: Taiwan Semiconductor Manufacturing Co., Ltd., Hsinchu (TW)

(72) Inventors: Jheng-Si Su, Zhubei (TW); Yu-Chen Wei, New Taipei (TW); Chih-Yuan Yang, Hsinchu (TW); Shih-Ho Lin, Jhubei (TW); Jen-Chieh Lai, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 225 days.

(21) Appl. No.: 15/993,001

(22) Filed: May 30, 2018

(65) Prior Publication Data

US 2019/0157129 A1    May 23, 2019

Related U.S. Application Data

(60) Provisional application No. 62/589,085, filed on Nov. 21, 2017.

(51) Int. Cl.
*H01L 21/683* (2006.01)
*H01L 21/677* (2006.01)
(Continued)

(52) U.S. Cl.
CPC .......... *H01L 21/6838* (2013.01); *B24B 37/20* (2013.01); *B25J 11/0095* (2013.01); *B25J 15/0616* (2013.01); *B65G 61/00* (2013.01); *H01L 21/67225* (2013.01); *H01L 21/67259* (2013.01); *H01L 21/67706* (2013.01); *H01L 21/67718* (2013.01); *H01L 21/67736* (2013.01);
(Continued)

(58) Field of Classification Search
CPC . H01L 21/677; H01L 21/84; H01L 21/67787; H01L 21/6779; H01L 21/6838; B25J 15/0019; B25J 11/0095; B65G 61/00
See application file for complete search history.

(56) References Cited

U.S. PATENT DOCUMENTS 3,930,684 A * 1/1976 Lasch, Jr. ........... H01L 21/6779
                                                           406/12
3,982,627 A * 9/1976 Isohata ............. H01L 21/67787
                                                           414/757
(Continued)

FOREIGN PATENT DOCUMENTS

CN       1783450 A      6/2006
CN     101081515 A     12/2007
(Continued)

*Primary Examiner* — Gerald McClain
(74) *Attorney, Agent, or Firm* — Birch, Stewart, Kolasch & Birch, LLP

(57) ABSTRACT

A method for transporting an article used in semiconductor fabrication is provided. The method includes moving a first transporter next to an article to have the article faces a plurality of gas holes formed on the first transporter; suspending the article with the first transporter in a non-contact manner by providing a flow of gas through the gas holes of the first transporter; and transferring the article with the first transporter while the flow of gas is continuously provided.

20 Claims, 22 Drawing Sheets

(51) Int. Cl.
  *H01L 21/687* (2006.01)
  *B25J 15/06* (2006.01)
  *B65G 61/00* (2006.01)
  *B24B 37/20* (2012.01)
  *H01L 21/67* (2006.01)
  *B25J 11/00* (2006.01)
(52) U.S. Cl.
  CPC .. *H01L 21/67742* (2013.01); *H01L 21/67766* (2013.01); *H01L 21/67778* (2013.01); *H01L 21/68707* (2013.01); *Y10S 901/40* (2013.01)

(56) References Cited

U.S. PATENT DOCUMENTS

| | | | | |
|---|---|---|---|---|
| 4,219,110 | A * | 8/1980 | Ubukata | B07C 5/02 198/380 |
| 4,242,038 | A * | 12/1980 | Santini | H01L 21/67787 406/87 |
| 4,735,449 | A * | 4/1988 | Kuma | H01L 21/67784 294/64.3 |
| 6,322,116 | B1 | 11/2001 | Stevens | |
| 6,810,297 | B2 * | 10/2004 | Adin | B65G 51/03 700/110 |
| 7,128,516 | B2 * | 10/2006 | Sugiyama | B65G 47/252 414/676 |
| 7,530,778 | B2 * | 5/2009 | Yassour | B65G 51/03 384/12 |
| 9,793,143 | B2 | 10/2017 | Yang et al. | |
| 2006/0054774 | A1 * | 3/2006 | Yassour | F16C 32/06 248/631 |
| 2011/0069306 | A1 * | 3/2011 | Doyle | H01L 21/6838 356/237.5 |
| 2012/0062877 | A1 * | 3/2012 | Doyle | H01L 21/6838 356/237.5 |
| 2018/0033697 | A1 * | 2/2018 | Suzuki | B65G 49/065 |

FOREIGN PATENT DOCUMENTS

| | | | | |
|---|---|---|---|---|
| CN | 101676181 | A | 3/2010 | |
| CN | 102687262 | A | 9/2012 | |
| CN | 105047593 | A | 11/2015 | |
| CN | 106409736 | A | 2/2017 | |
| JP | 2010227850 | A * | 10/2010 | |
| TW | 201039928 | A1 | 11/2010 | |
| WO | WO 2015/136495 | A1 | 9/2016 | |
| WO | WO-2016136495 | A1 * | 9/2016 | B65G 49/065 |

* cited by examiner

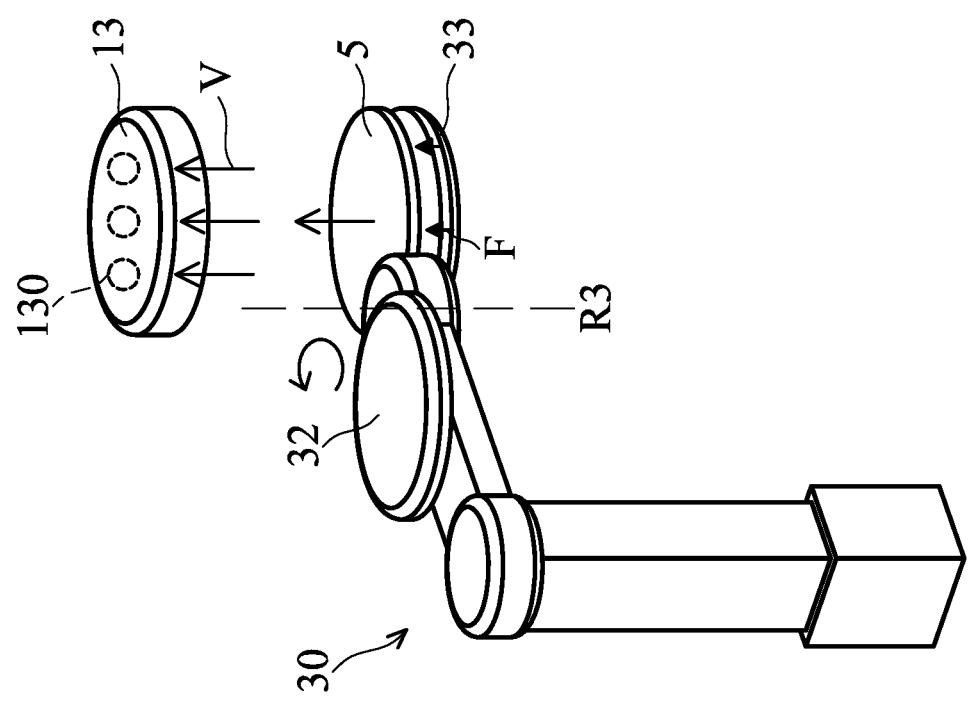

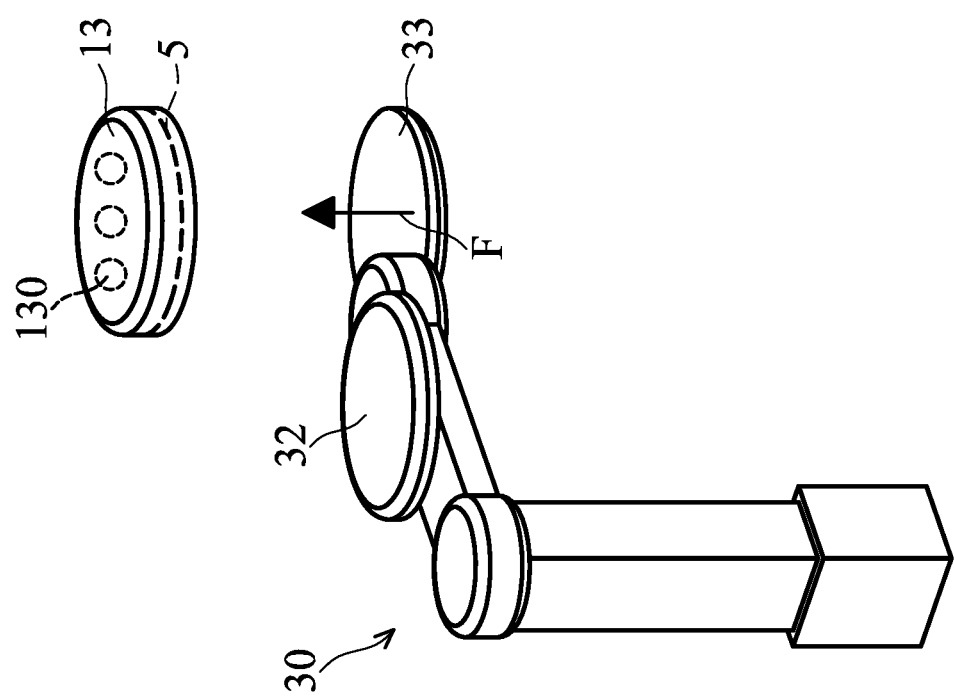

ARTICLE TRANSFERRING METHOD IN SEMICONDUCTOR FABRICATION

PRIORITY CLAIM AND CROSS-REFERENCE

This application claims the benefit of U.S. Provisional Application No. 62/589,085, filed on Nov. 21, 2017, the entirety of which is incorporated by reference herein.

BACKGROUND

Transporting or conveying articles for processing is performed throughout the process of manufacturing a semiconductor device. Conventionally, articles are conveyed in a fabrication plant by automatically guided vehicles or overhead transport vehicles that travel on predetermined routes or tracks. For the conveyance of articles, the articles are normally loaded into containers, such as SMIF (a standard machine interface) or FOUP (a front opening unified pod), and then picked up and placed in the automatic conveying vehicles. When the article is transferred to a processing apparatus, the article is removed from the container and moved in the processing apparatus by a transferring module that includes a manipulator.

A semiconductor wafer is one sort of article that may be positioned in the container, and various device elements are formed on the semiconductor wafer. Examples of device elements that are formed on the semiconductor wafer include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and other applicable elements.

Alternatively, articles may include a test wafer. The test wafer is used to monitor the integrity of a work station to be used in a semiconductor device fabrication process flow. Alternatively, articles positioned in the containers may include a photomask or reticle. The photomask or the reticle is used in a photolithography exposure process of the semiconductor device fabrication process.

Although existing methods for transferring the article in the processing apparatus have generally been adequate for their intended purposes, they have not been entirely satisfactory in all respects. Consequently, it would be desirable to provide a solution for a transferring tool for article transfer operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 6H shows a schematic view of one stage of a method for transferring an article as one of platen is driven to be rotated about a rotation axis, in accordance with some embodiments.

FIG. 6I shows a schematic view of one stage of a method for transferring an article as the article is loading onto a holding member, in accordance with some embodiments.

DETAILED DESCRIPTION

Figure 1:
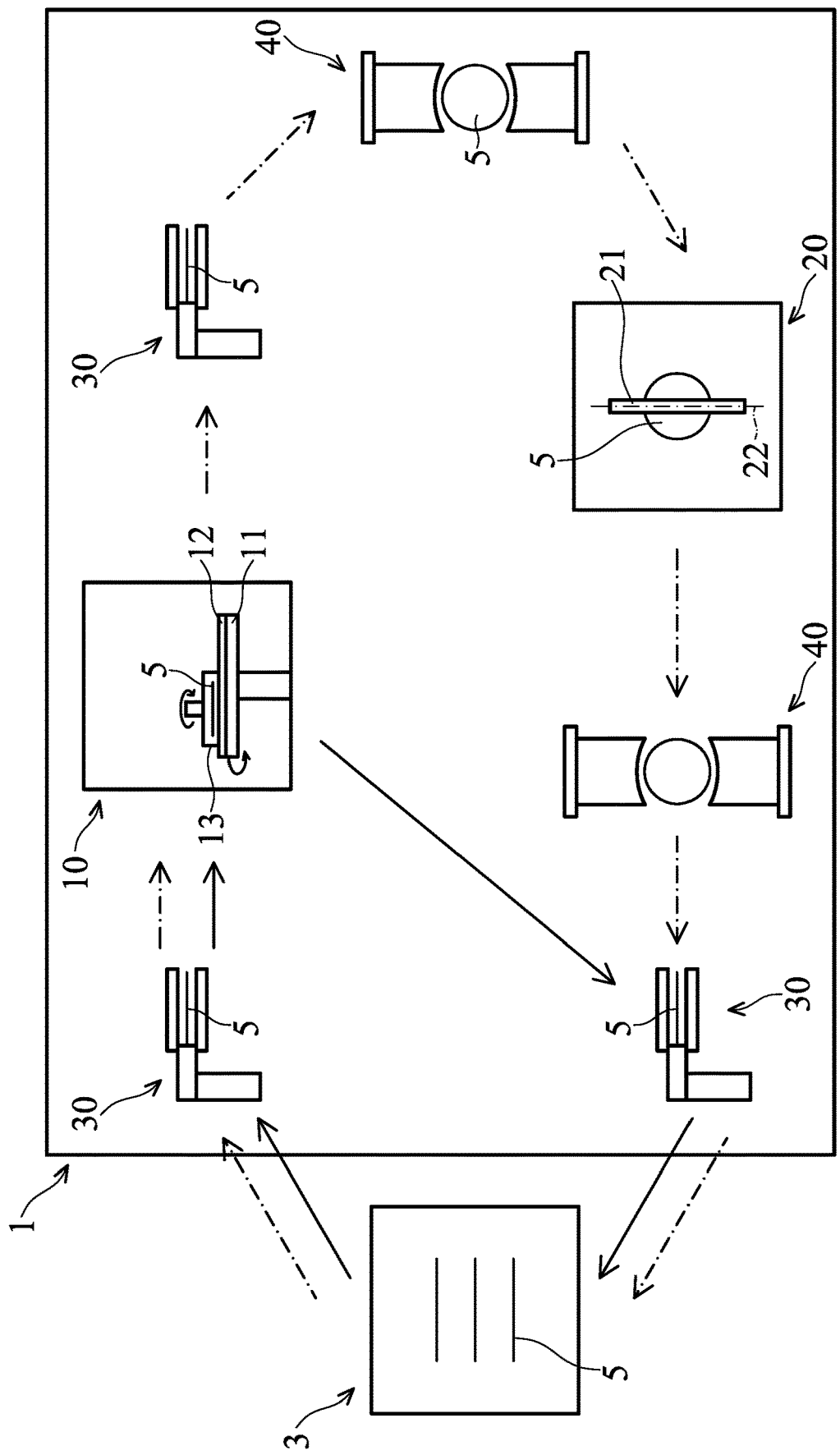
FIG. 1 shows a schematic view of an article transfer route between a processing apparatus and a container and between different elements in the processing apparatus, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 shows a schematic view of an article transfer route between a processing tool 10 and a container 3 and between different elements in the processing tool 10, in accordance with some embodiments. The processing apparatus 1 is configured for performing a wafer fabrication process. The processing apparatus 1 may include any type of wafer processing tools used in semiconductor chip fabrication.

In the following description, the processing apparatus 1 is a chemical mechanical polishing (CMP) tool for performing a CMP process, and the article 5 to be transferred in the processing apparatus 1 is a semiconductor wafer. However, it should be appreciated that many variations and modifications can be made to embodiments of the disclosure.

In an alternative, the processing apparatus 1 is a lithography tool for performing a lithography process, and the article 5 to be transferred in the processing apparatus 1 is a semiconductor wafer or a reticle having IC design patterns for lithography process. In yet another alternative, the processing apparatus 1 may include metrology, inspection, testing or other tool, and the article 5 to be transferred in the processing apparatus 1 is a semiconductor wafer.

In some embodiments, the processing apparatus 1 includes a number of processing tools, such as processing tool 10 and processing tool 20. Details of processing tool 10 and processing tool 20 are described below, in accordance with some embodiments.

The processing tool 10 is a tool for performing a CMP process. In some embodiments, as shown in FIG. 1, the processing tool 10 includes a polishing stage 11, a polishing pad 12 and a holding member 13, in accordance with some embodiments. The polishing pad 12 is formed of a material that is hard enough to allow the abrasive particles in slurry to mechanically polish the article 5, which is placed under the holding member 13, during the CMP process. On the other hand, the polishing pad 12 is also soft enough so that it does not substantially scratch the article 5.

In accordance with some embodiments, the polishing pad 12 is attached to the polishing stage 11 by an adhesive film, adhesive, or glue, for example. During the CMP process, the polishing stage 11 is rotated by a mechanism, such as a shaft coupled a rotating motor (not shown), and hence the polishing pad 12 fixed thereon is also rotated along the polishing stage 11.

The holding member 13 is configured to hold and move the article 5 in various stages of the CMP process. For example, as the article 5 to be polished is held by the holding member 13, the holding member 13 is driven by a mechanism, such as a pivotable arm and a motor (not shown), to move over the article 5. The article 5 is then picked up by the holding member 13.

In accordance with some embodiments, the holding member 13 includes a number of air passages 130 (FIG. 6I shows this feature more clearly), in which a vacuum may be generated. By vacuuming the air passages, the article 5 is sucked up and held on the bottom of the holding member 13 for the transportation of the article 5 to the polishing pad 12.

During the CMP process, the holding member 13 is operable to provide a predetermined amount of pressure to press the article 5 against the polishing pad 12 for mechanical polishing. For example, after the holding member 13 is moved over and also pressed against the polishing pad 12, the vacuuming in the air passages is then turned off, and hence the article 5 is no longer sucked up. Afterwards, a flexible membrane (not shown) disposed between the bottom of the holding member 13 and the article 5 is inflated, for example, by pumping air into zones in the flexible membrane, and hence the inflated flexible membrane presses the article 5 against the polishing pad 12.

During the CMP process, the holding member 13 is also rotated by a mechanism, such as a shaft coupled a rotating motor (not shown), causing the rotation of the article 5 affixed to the holding member 13. In accordance with some embodiments, the holding member 13 and the polishing pad 12 rotate in the same direction (clockwise or counterclockwise). In accordance with alternative embodiments, the holding member 13 and the polishing pad 12 rotate in opposite directions.

With the rotation of the polishing pad 12 and the holding member 13, the slurry flows between the article 5 and the polishing pad 12 through surface grooves (not shown) formed a the polishing surface of the polishing pad 12. Through the chemical reaction between the reactive chemicals in the slurry and the top surface of the article 5, and further through the mechanical polishing (i.e. through contact and friction between the top surface of the article 5 and the polishing surface), the top surface of the article 5 is planarized.

The processing tool 10 may further include other elements, such as slurry dispenser (not shown in figures), operable to dispense slurry onto the polishing pad 12 during the CMP process, and pad conditioner (not shown in figures) operable to dispense slurry onto the polishing pad 12 during the CMP process.

The processing tool 20 is configured to perform a post-CMP cleaning process to remove all polishing slurry, polishing residues in a quick and repeatable fashion. In some embodiments, the processing tool 20 includes two brush members 21 (only one brush member is shown in FIG. 1), the two brush members 21 are positioned adjacent each other with a gap formed therebetween. The two brush members 21 extend in a vertical direction and are rotatable about rotation axes 22 that are parallel to the vertical direction. Therefore, the article being process by the processing tool is kept in an upright position, as shown in FIG. 1.

As indicated by dashed arrows shown in FIG. 1, for the article 5 which is going to be processed by the post-CMP cleaning process, the article 5 is transferred from the processing tool 10 to the processing tool 20 with transporters 30 and 40 (which will be described in detail later). The article 5 is cleaned by a cleaning liquid, such as deionized water (DIW) and is dried. After the post-CMP cleaning process, the article 5 is transferred from the processing tool 20 to the carriage 3 with the transporters 30 and 40. In contrast, as indicated by the solid arrows, for the article 5 which is not processed by the processing tool 20, the article 5 is transferred between the carriage 3 and the processing tool 10 with the transporter 30.

The transporter 30 is configured for physically transporting the article 5. For example, the transporter 30 may retrieve the article 5 to and from a carrier 3, or the transporter 30 may transport the article 5 to and from the processing tool 10, or the transporter 30 may transport the article 5 to and from another transporter 40. However, the locations where the transporter 30 may transport the article 5 are not limited by the present embodiment.

Figure 2:
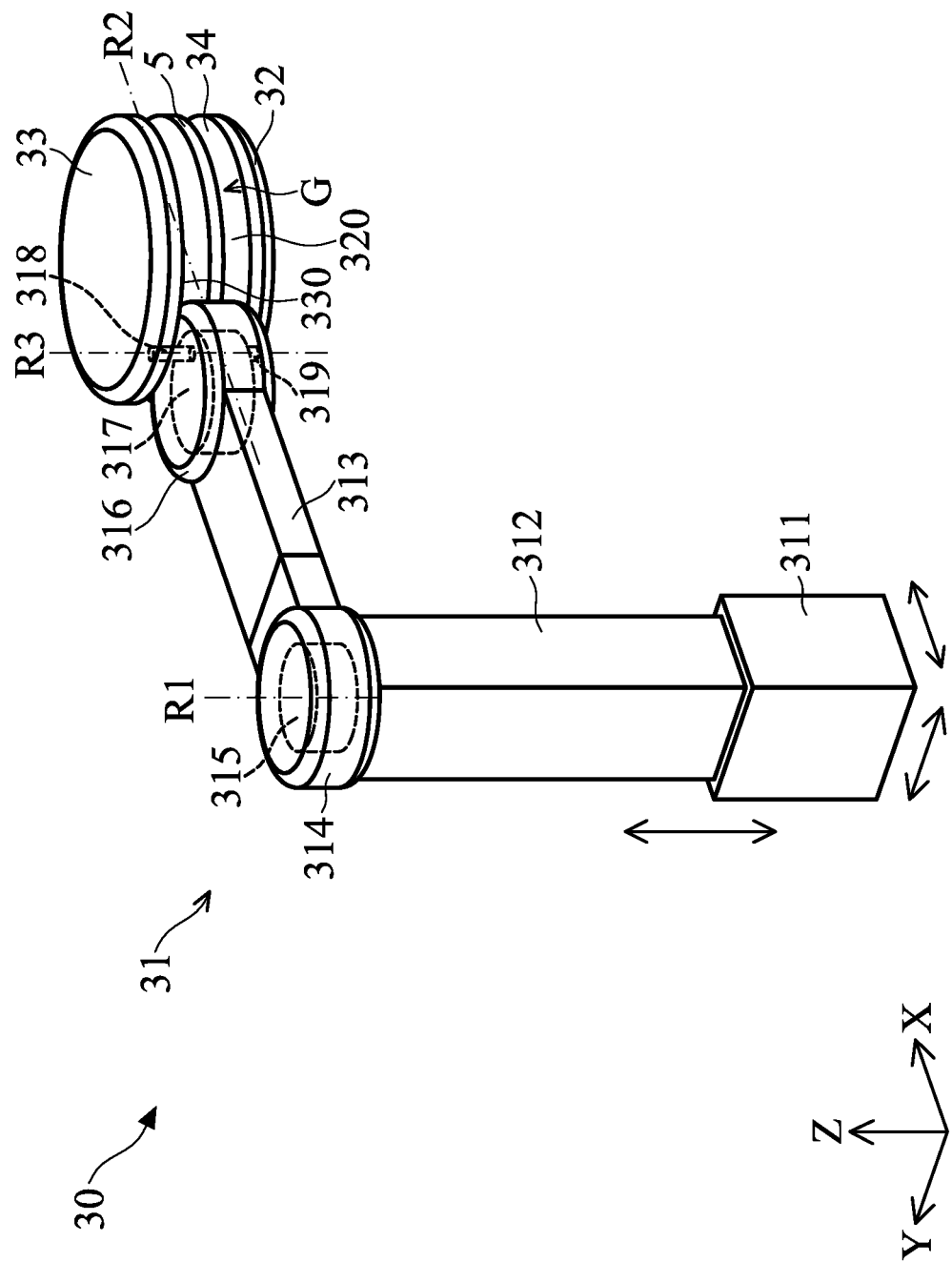
FIG. 2 shows a schematic view of a transporter for transferring an article, in accordance with some embodiments.

FIG. 2 shows a schematic view of the transporter 30 with an article 5 suspended thereon, in accordance with some embodiments. The transporter 30 includes a robot arm 31 and two platens 32 and 33. The robot arm 31 is configured to move and position the article 5 in the processing apparatus 1.

In some embodiments, the robot arm 31 includes a first post 311 and a second post 312. The first post 311 may be moved along a horizontal direction X and a horizontal direction Y as indicated by the arrow in FIG. 2. The second post 312 is telescoped with the first post 311. The second post 312 may be driven to slide relative to the first post 311 by a cylinder (not shown in figures), such as linear motor, in the vertical direction Z as indicated by the arrow in FIG. 2. The output power of the cylinder may be in the range from about 0.2 W to about 20 W.

The robot arm 31 further includes a link 313. In some embodiments, the link 313 is connected to the second post 312 via a joint 314. The joint 314 is rotatably connected to the second post 312 about a rotation axis R1. The rotation axis R1 may be parallel to the vertical direction Z. The joint 314 may include a driving member 315, such as a step motor, to actuate the joint 314 and the link 313 to rotate around the rotation axis R1. The rotation angle of the joint 314 relative to the second post 312 may be in the range from about 0 degrees to about 360 degrees.

In some embodiments, the platen 32 and the platen 33 are connected to the link 313 via a joint 316. The joint 316 is rotatable connected to the link 313 about a rotation axis R2. The rotation axis R2 may be parallel to the horizontal direction X. The joint 316 may include a driving member 317, such as a step motor, to actuate the joint 314, the platen 32 and the platen 33 to rotate around the rotation axis R2.

In some embodiments, the platen 32 and the platen 33 are connected to the driving member 317 via a shaft 318 and a shaft 319, respectively. The shaft 318 and the shaft 319 may be connected to edges of the platen 32 and the platen 33. The driving member 317 independently drives the rotation of the two platens 32 and 33 about a rotation axis R3. The rotation axis R3 may be parallel to the vertical direction Z. The rotation angle of the platen 32 and the platen 33 relative to the joint 316 may be in the range from about 0 degrees to about 180 degrees.

In some embodiments, when one of the platen 32 and the platen 33 is rotated at 180 degrees and the other one stays at 0 degree, the platen 32 and the platen 33 are arranged to be offset from each other (i.e. projections of the platen 32 and the platen 33 in the vertical direction Z are not entirely covered with each other.) With this arrangement, when one of the platen 32 and the platen 33 is rotated at 180 degrees, the article 5 can be unloaded by other device from the other one of the platen 32 and the platen 33 that stays at 0 degree.

However, it should be appreciated that many variations and modifications can be made to embodiments of the disclosure. In the cases where the widths of the platen 32 and the platen 33 are sufficiently greater than a width of the article 5 to be supported by the transporter 30, the article 5 may be unloaded from the transporter 30 by rotating one of the platen 32 and the platen 33 to have a rotation angle that is less than 180 degrees. That is, the projections of the platen 32 and the platen 33 in the vertical direction Z are partially overlapped with each other. In such embodiments, the rotation angle may be in the range from about 90 degrees to about 180 degrees.

Figure 4A:
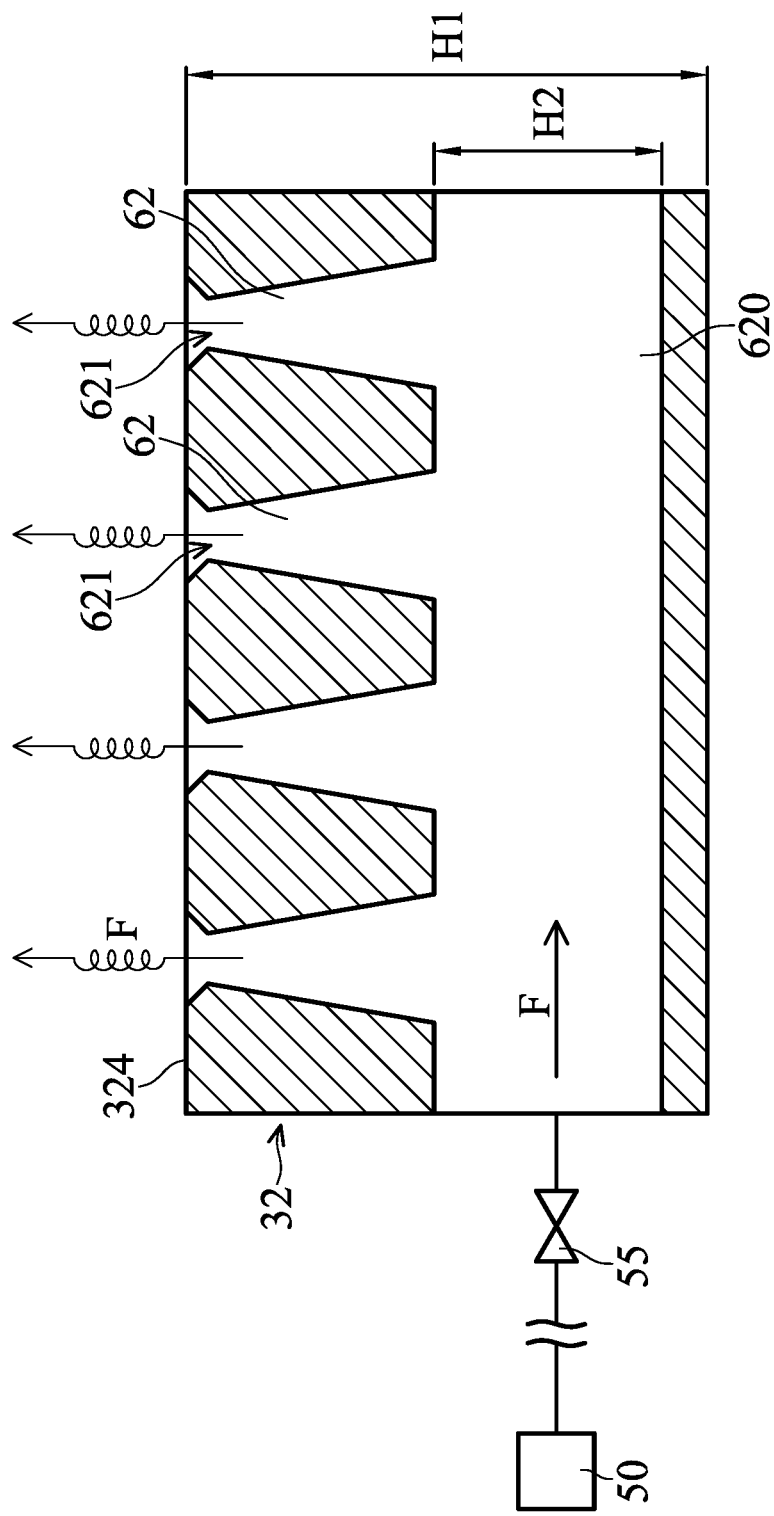
FIG. 4A shows a cross-sectional view of a platen, in accordance with some embodiments.

Still referring FIG. 2, the platen 32 and the platen 33 each has a thin structure with a small thickness to width ratio. For example, in cases where a 12-inch (300 mm) semiconductor wafer is transported by the transporter 30 in the processing apparatus 1, each of the platens 32 and 33 has a thickness H1 (FIG. 4A shows this feature more clearly), of about 1.8 mm to about 2.2 mm, and has a width (or diameter) of about 12 inches or slightly greater than 12 inches.

It should be appreciated that the dimension of each of the platens 32 and 33 should not be limited to the embodiments. The thickness of platen 32 and platen 33 can be determined depending on the space where the platens 32 and 33 are going to be inserted. Moreover, the width of each of the platens 32 and 33 is designed to have a width that is the same as or slightly greater than a width of the article 5 to be transported by the transporter 30, such as 6 inches, 8 inches or 18 inches.

In some embodiments, the platen 32 has an inner surface 320, and the platen 33 has an inner surface 330. The platen 32 and the platen 33 are positioned on the joint 316 in such a way that the inner surfaces 320 of the platen 32 can be directly facing the inner surface 330 of the platen 33 and a gap G is formed between platen 32 and platen 33. The gap G may have a width that is sufficiently greater than a thickness of the article 5 that is going to be transported by the transporter 30. In some embodiments, the width of the gap G is in the range from about 2.7 mm to about 3 mm.

Figure 3:
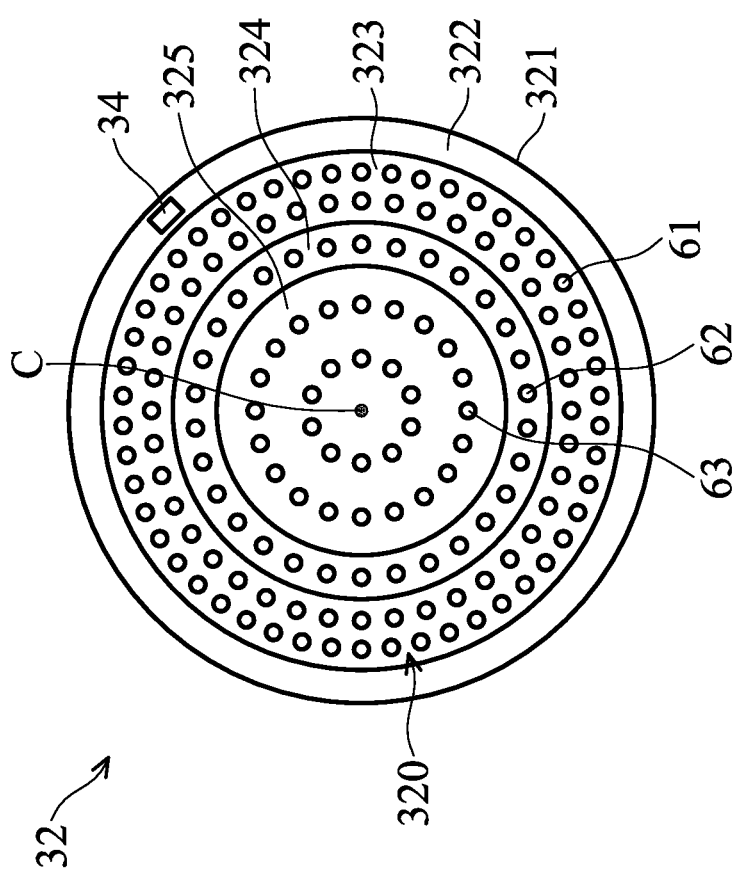
FIG. 3 shows a top view of a platen, in accordance with some embodiments.

FIG. 3 shows a top view of the platen 32, in accordance with some embodiments. In some embodiments, the inner surface 320 of the platen 32 has a number of ring-shape regions concentrically arranged. For example, the inner surface 320 of the platen 32 has a peripheral ring-shape region 322, a first ring-shape region 323 and a second ring-shape region 324.

The peripheral ring-shape region 322 is positioned adjacent an outer edge 321 of the inner surface 320. The first ring-shape region 323 is connected to an inner side of the peripheral ring-shape region 322 that is away from the outer edge 321. The second ring-shape region 324 is connected to an inner side of the first ring-shape region 323 that is away from the peripheral ring-shape region 322. Surrounded by the inner most ring-shape region (i.e. the second ring-shape region 324), there is a central region 325 located relative to a center C of the inner surface 320 of the platen 32.

In some embodiments, a ratio of the area of the first ring-shape region 323, the second ring-shape region 324 and the central region 325 is about 2:3:4. For example, the area of the first ring-shape region 323 is about 2276.5 mm$^2$, and the area of the second ring-shape region 324 is about 3846.5 mm$^2$, and the area of the central region 325 is about 4474.5 mm2 in the cases where a 12-in wafer is supported. However, it should be appreciated that many variations and modifications can be made to embodiments of the disclosure. In some other embodiments, the platen 32 is used to support wafer having about 6 inches to about 12 inches in diameter. In some embodiments, a width of the peripheral ring-shape region 324 between the first ring-shape region 323 and the outer edge 321 is of about 1 mm.

In some embodiments, there is a detector 34 positioned between the platen 32 and the platen 33. In the embodiment shown in FIG. 3, the detector 34 is placed on the peripheral ring-shape region 322 of the inner surface 320. The detector 34 is configured to detect the position of the article 5 located between the platen 32 and the platen 33. The detector 34 may emit energy beam such as laser, sonar, or microwave, to the article 5 and receives a reflected energy beam from the article 5. Afterwards, the detector 34 calculates the height of the article 5 relative to the inner surface 320 by multiplying the velocity of the energy beam and the traveling time of the energy beam. The detected results are sent to a controller (not shown in figures) for performing a closed-loop leveling control (which will be described in detail later).

In some embodiments, there are a number of gas holes formed in each of the first ring-shape region 323, the second ring-shape region 324 and the central region 325, but the peripheral ring-shape regions 322 is free of the gas holes. For example, there are a number of gas holes 61 formed in first ring-shape region 323, and there are a number of gas holes 62 formed in the second ring-shape region 324, and there are a number of gas holes 63 formed in the central region 325.

The gas holes 61, 62 and 63 formed on the first ring-shape region 323, the second ring-shape region 324 and the central region 325 may be arranged in a ring configuration. In addition, within each of the first ring-shape region 323, the second ring-shape region 324 and the central region 325, there would be multiple groups of the gas holes formed concentrically. For example, within the first ring-shape region 323 there are two groups of gas holes 61. Each of the two groups of gas holes 61 is arranged in a ring configuration. In addition, the two groups of gas holes 61 are concentrically formed on the first ring-shape region 323.

In some embodiments, the gas holes in each region are connected to a conduit allowing the moving of gas from a gas supplier to the gas holes. The conduit in two neighboring regions may be separated and connected to the gas supplier via different valves. For example, as shown in FIG. 4A, a conduit 620 is formed below the second ring-shape region 324. The conduit 620 may be parallel with the second ring-shape region 324, and a height H2 of the conduit 620 in a thickness direction of the platen 32 is of about 1 mm to about 1.7 mm. The gas holes 62 formed on the second ring-shape region 324 are connected to the conduit 620, and the conduit 620 is fluidly connected to a gas supplier 50 (which will be described later) via a valve 55, and as such the flow of gas supplied from the gas supplier 50 is discharged the outside via the conduit 620 and the gas holes 62 when the valve 55 is turned on.

Figure 4B:
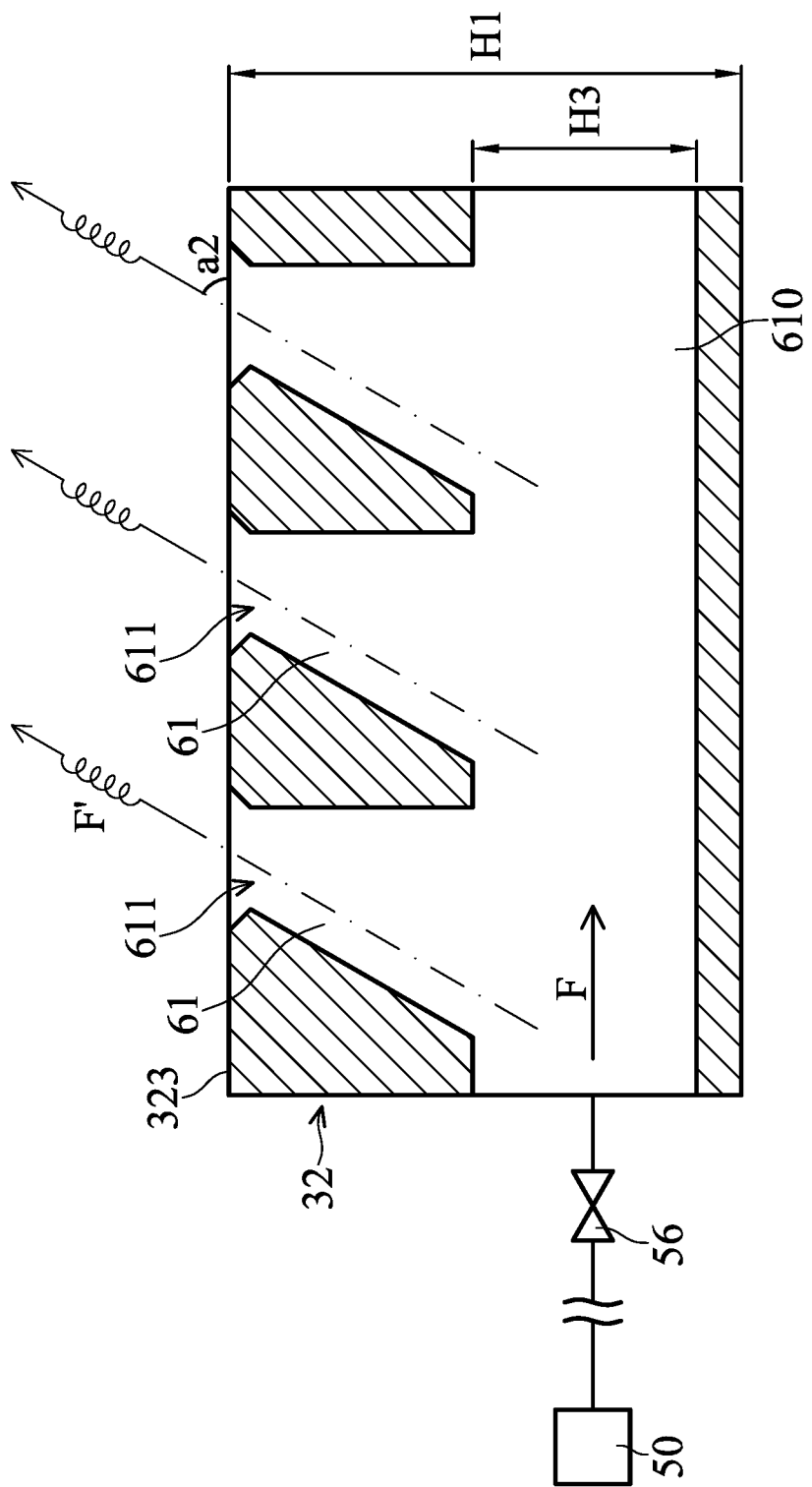
FIG. 4B shows a cross-sectional view of a platen, in accordance with some embodiments.

Moreover, as shown in FIG. 4B, a conduit 610 is formed below the first ring-shape region 323. The conduit 610 may be parallel with the first ring-shape region 323, and a height H3 of the conduit 610 in a thickness direction of the platen 32 is of about 1 mm to about 1.7 mm. The gas holes 61 formed on the first ring-shape region 323 are connected to the conduit 610, and the conduit 610 may be fluidly connected to the gas supplier 50 via a valve 56, and as such the flow of gas supplied from the gas supplier 50 is discharged outside via the conduit 610 and the gas holes 61 when the valve 56 is turned on.

The structural features, in accordance with some embodiments, of the gas holes 61, 62 and 63 are described below.

In some embodiments, as shown in FIG. 4A, the gas holes 62 formed on the second ring-shape region 324 each has a tapered cross section. The taper angle of the gas holes 62 ranges from about 0 degrees to about 30 degrees. With the tapered cross section, a compressed flow of gas F can be discharged by the gas holes 62. As a result, an operating voltage of the gas supplier 50 to actuate the flow of gas F can be decreased. In addition, the gas holes 62 are extended in a direction that is perpendicular to the second ring-shape region 324. Guided by the gas holes 62, the flow of gas F is moved along a direction that is substantially perpendicular to the second ring-shape region 324.

In some embodiments, a turbulent structure 621 is connected to each of the gas holes 62 and located next to the second ring-shape region 324. The turbulent structure 621 may be tapered in a direction opposite to that of the gas hole 62 thereby forming a funnel-shape gas discharging hole. With the turbulent structure 621, the stationary and laminar flow of gas F passing the gas hole 62 is transformed into a turbulent flow of gas F, as shown in FIG. 4A. The turbulent flow of gas F may generate greater pneumatic force to control the position of the article 5 (FIG. 2) during the transfer. However, it should be appreciated that many variations and modifications can be made to embodiments of the disclosure. In some other embodiments, the turbulent structure 621 is omitted and a stationary and laminar flow of gas is discharged by the gas hole 62 rather than turbulent flow of gas.

In some embodiments, as shown in FIG. 4B, the gas holes 61 formed on the first ring-shape region 323 each has a tapered cross section. The taper angle of the gas holes 61 ranges from about 0 degrees to about 30 degrees. With the tapered cross section, a compressed flow of gas F' can be discharged by the gas holes 61. As a result, an operating voltage of the gas supplier 50 to actuate the flow of gas F' can be decreased. In addition, the gas holes 61 are extended in a direction that is inclined relative to the first ring-shape region 323 at an angle a2 ranged from about 8 degrees to about 12 degrees. Guided by the gas holes 61, the flow of gas F' is moved along a direction that is inclined relative to the first ring-shape region 323.

In some embodiments, a turbulent structure 611 is connected to each of the gas holes 61 and located next to the first ring-shape region 323. The turbulent structure 611 may be tapered in a direction opposite to that of the gas hole 61 thereby forming a funnel-shape gas discharging hole. With the turbulent structure 611, the stationary and laminar flow of gas F passing the gas hole 61 is transformed into a turbulent flow of gas F', as shown in FIG. 4B. The turbulent flow of gas F' may generate greater pneumatic force to control the position of the article 5 (FIG. 2) during the transfer. However, it should be appreciated that many variations and modifications can be made to embodiments of the disclosure. In some other embodiments, the turbulent structure 611 is omitted and a stationary and laminar flow of gas is discharged by the gas hole 61 rather than turbulent flow of gas.

In some embodiments, the gas holes 63 formed on the central ring-shape region 325 has the same or similar configuration as the gas holes 62 formed on the second ring-shape region 324; therefore, the features of the gas holes 63 will not be described in detail for the sake of brevity. The gas holes 63 may be connected to another conduit (not shown in figures) formed below the central region 325 and connected to the gas supplier 50 via another valve (not shown in figures) that is independently controlled by the valve 55. Namely, the flow of gas through the gas holes 62 and the flow of gas through the gas holes 63 can be controlled independently.

In some embodiments, the platen 33 also includes a number of gas holes formed on the inner surface 330 of the platen 33. The gas holes formed on the inner surface 330 have the same configuration as the gas holes 61, 62 and 63 formed on the platen 32; therefore, the feature of the gas holes formed on the inner surface 330 and will not be described for the sake of brevity.

Figure 5:
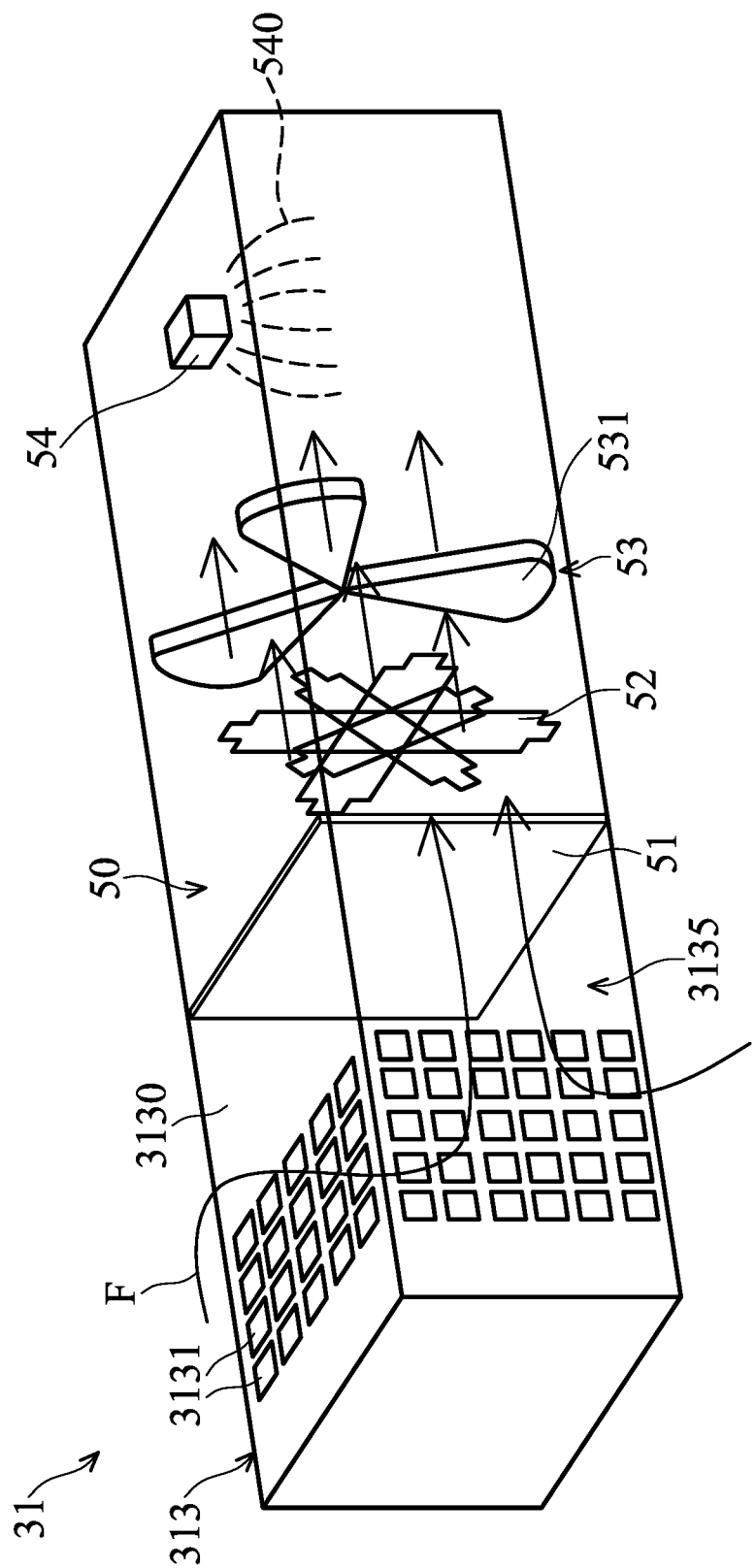
FIG. 5 shows a schematic view of a gas supplier positioned in an arm, in accordance with some embodiments.

FIG. 5 shows a schematic view of the gas supplier 50 positioned in the link 313 of the robotic arm 31, in accordance with some embodiments. In some embodiments, the gas supplier 50 is positioned in the link 313 of the robotic arm 31. The link 313 is a hollowed structure with a channel 3135 formed therein. The channel 3135 is placed in communication with the conduits, such as conduit 610 and 620 formed in the platen 32 and the platen 33.

In some embodiments, the gas supplier 50 includes an air filter 51, an actuator 52, an impeller 53 and a flow regulator 54. A number of through holes 3131 are formed on side walls 3130 of the link 313. The through holes 3131 allow gas communication between an outside of the link 313 and the channel 3135. The air filter 51 is positioned adjacent to the through holes 3131 and is configured to physically block particle or contamination gas while letting clean gas through. The air filter 51 may include a high efficiency particulate air (HEPA) filter with filter size ranged from about 0.1 um to about 0.3 um.

The actuator 52 is located downstream of the air filter 51. The actuator 52 includes a direct drive motor and is configured to drive the rotation of the impeller 53. The direct drive motor is a type of permanent-magnet synchronous motor that directly drives the load. As a result, the need for a transmission or gearbox is eliminated.

In some embodiments, the impeller 53 is a fan configured to actuate a flow of gas F in the channel 3135. In such embodiments, the impeller 53 is connected to the actuator 52 and includes a number of blades 531, such as 3-7 blades. The blades 531 may be made of polyether ether ketone (PEEK) material, and the impeller 53 may have a diameter of about 180 mm to about 220 mm. The output power of the actuator 52 may be in the range from about 0.5 W to about 85 W. The actuator 52 drives the impeller having a house power (HP) of about 0.5 to about 2 and generate a flow of gas F having a volume flow rate of about 5 (cubic meter per minute) CMM to about 12 CMM.

In some embodiments, the flow regulator 54 includes a mist spray generator and is configured to discharge a mist spray 540 into the channel 3135. With the mist spray generator, the flow of gas F in the channel 3135 will be mixed with the mist spray 540 before being discharged through the gas holes formed on platen 32 and platen 33. In some embodiments, the mist spray generator includes an ultrasonic oscillator. A liquid or mixture is provided from a liquid source (not shown in figures) and is converted to mist spray 540 by ultrasonic energy generated by the mist spray generator. The discharge of the mist spray 540 can be selectively initiated depending on the process to which the suspended article 5 (FIG. 2) is subjected. For example, during transfer of the article 5 after the CMP process, the mist spray generator is turned on to discharge the mist spray 540 so as to prevent defects due to slurry condensation.

In some other embodiments, the flow regulator 54 includes a heating member and is configured to heat up the flow of gas F in the channel 3135 before the flow of gas F is discharged through the gas holes 61, 62 and 63 (FIG. 3) formed on platen 32 and platen 33. In some embodiments, the flow regulator 54 includes both the mist spray generator and the heating member. In such embodiments, the heating function and the mist spray discharge function can be started up simultaneously so as to provide heated mist spray 540 into the flow of gas F.

Figure 6A:
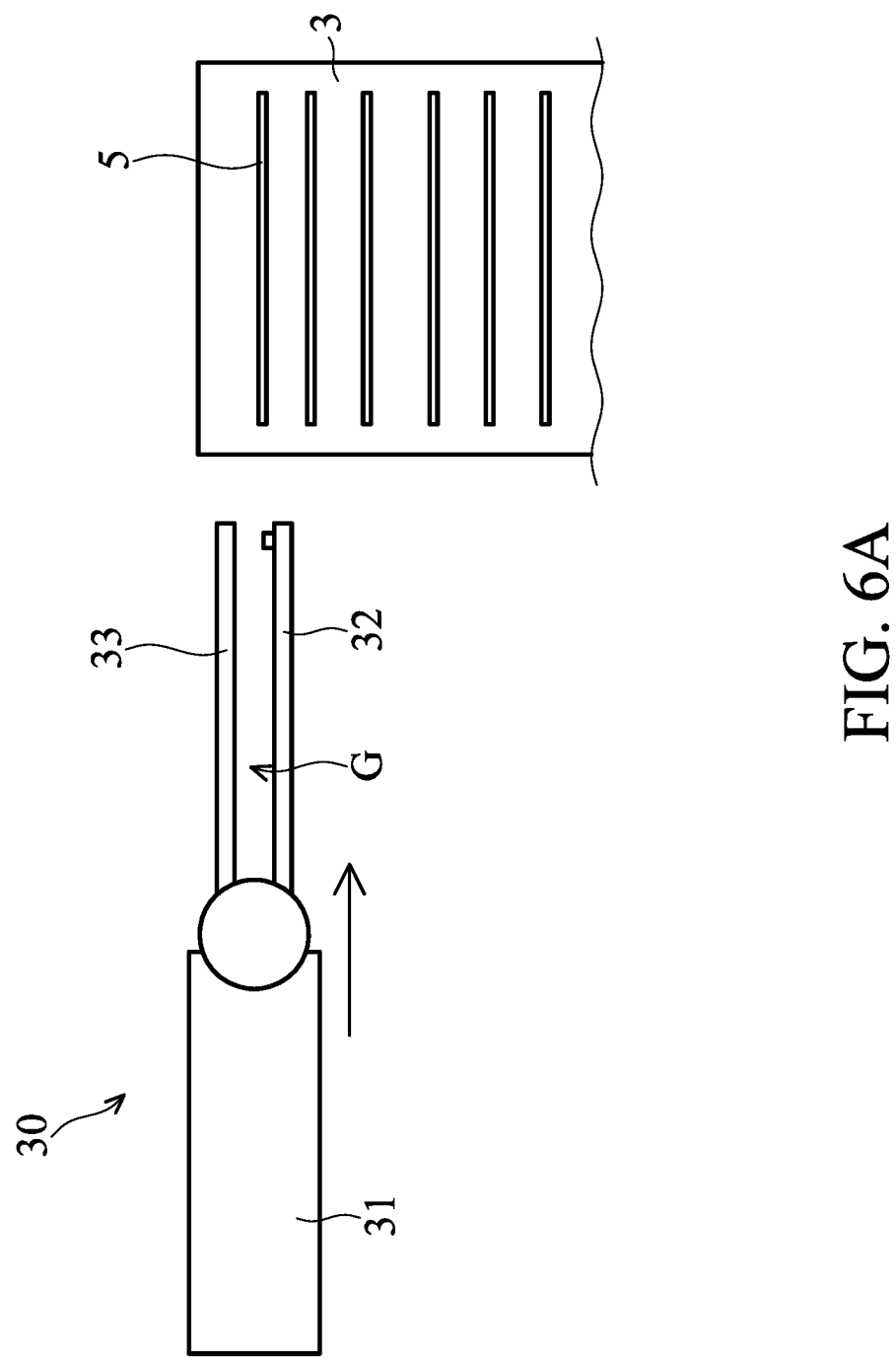
FIG. 6A shows a schematic view of one stage of a method for transferring an article before a transporter inserts into a container, in accordance with some embodiments.

FIGS. 6A-6I shows schematic views of stages of a method for transferring an article 5 from the carrier 3 to the processing tool 10, in accordance with some embodiments. The article 5 may include a semiconductor wafer, a test wafer or a photomask for a lithography exposure process. In some embodiments, the article 5 is stored in the carrier 3 and conveyed to a load port (not shown in figures) of the processing system 1 (FIG. 1). To transfer the article 5 from the carrier 3 to the processing tool 10, the transporter 30 is moved to a position in front of the carrier 3, as shown in FIG. 6A. The gap G between the platen 32 and the platen 33 is aligned with the article 5 which is to be moved to the processing tool 10.

Figure 6B:
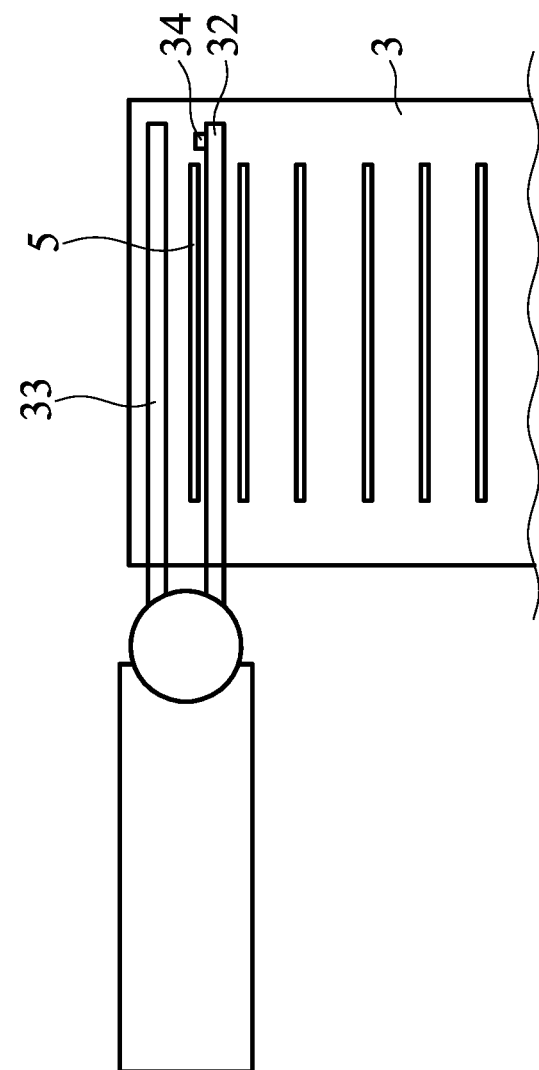
FIG. 6B shows a schematic view of one stage of a method for transferring an article as a transporter is moved next to the article, in accordance with some embodiments.

Afterwards, the platen 32 and the platen 33 are moved by the robotic arm 31 along a direction as indicated by the arrow in FIG. 6A. The movement of the platen 32 and the platen 33 is stopped, when the platen 32 and the platen 33 are inserted into the carrier 3 to have the article 5 positioned between the platen 32 and the platen 33, as shown in FIG. 6B. In some embodiments, before the discharge of the flow of gas, the article 5 is entirely covered by the platen 32 and the platen 33, an outer edge of the article 5 is not exposed outside as seen from top view.

Figure 6C:
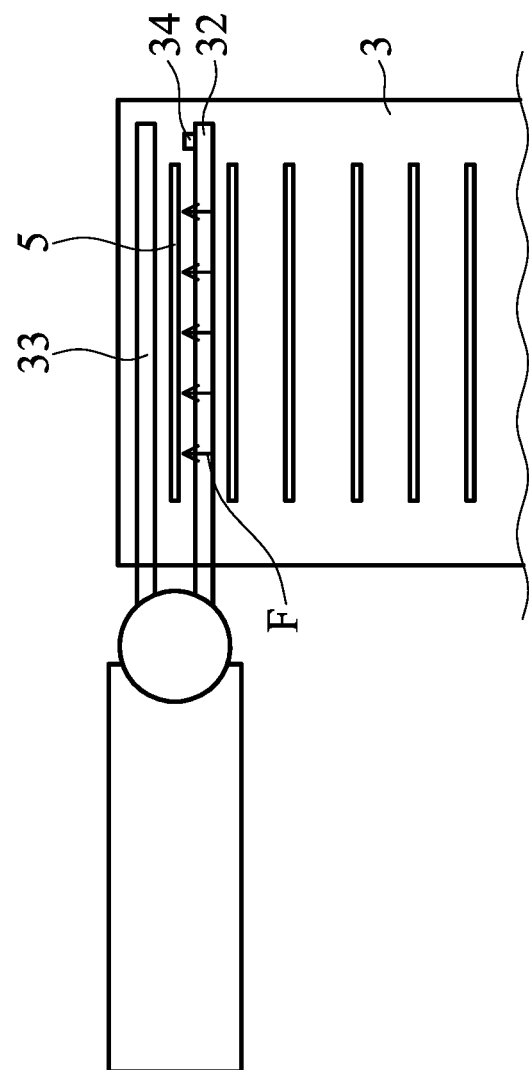
FIG. 6C shows a schematic view of one stage of a method for transferring an article as the article is suspended by an upward gas flow, in accordance with some embodiments.

Afterwards, the article 5 is suspended by the flow of gas F from the platen 32 located below the article 5 in a non-contact manner, as shown in FIG. 6C. The flow of gas F is actuated by the gas supplier 50 and is discharged toward the article 5 through the gas holes 62 and 63 (FIG. 3), but there is no flow of gas passing through the gas holes 61 (FIG. 3). The flow of gas F from the platen 32 generates a pneumatic force in a first normal direction on the article 5. The first normal direction is perpendicular to the inner surface 320 of the platen 32. As a result, the article 5 is moved toward the platen 33. In some embodiments, the pneumatic force generated by the flow of gas F from the gas holes 62 and 63 satisfies equation $P = X*9.8 \text{ kg*m/sec}^2)*1.02$, where the P is the pneumatic force and X is the weight of the article 5.

Figure 6D:
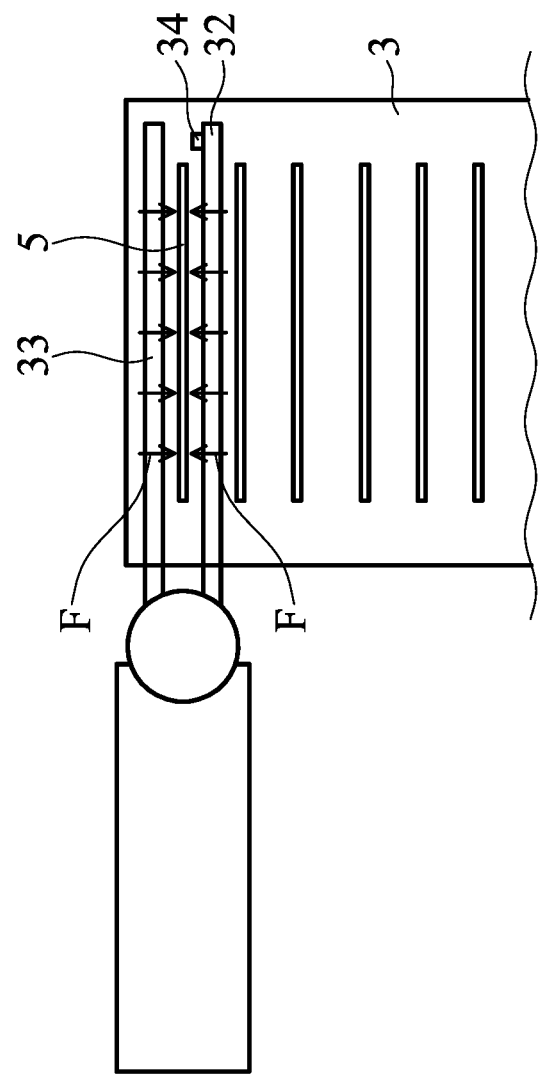
FIG. 6D shows a schematic view of one stage of a method for transferring an article as the position of the article is adjusted by both downward and upward gas flows, in accordance with some embodiments.

When the article 5 is suspended by the flow of gas F from the platen 32, another flow of gas F is discharged from the platen 33 located above the article 5, as shown in FIG. 6D. The flow of gas F from the platen 33 generates a pneumatic force on the article 5 in a second normal direction. The second normal direction is perpendicular to the inner surface 330 of the platen 33 and opposite to the first normal direction. As a result, the article 5 is slightly moved downwardly to a predetermined position. In the predetermined position, the height of the article 5 is controlled within the range from about 0.4 mm to about 2.3 mm relative to the platen 32. In some other embodiments, there is no flow of gas discharged from the platen 33 located above the article 5. The article 5 is moved to the predetermined position by the flow of gas F from the platen 32.

In some embodiments, the flow of gas F from the platen 32 is initiated when the detector 34 detects the presence of the article 5 between the platen 32 and the platen 33. In some embodiments, the flow of gas F from the platen 33 is initiated when the detector 34 detects the height of the article 5 relative to the platen 32 is greater than a predetermined value. For example, when the height of the article 5 relative to the platen 32 is greater than 5 mm, the flow of gas F from the platen 33 is initiated.

In some embodiments, a closed-loop leveling control is carried out to stably suspend the article 5 at the predetermined position. Specifically, when the article 5 is suspended between the platen 32 and the platen 33, the detector 34 monitors the height of the article 5 relative to the platen 32 and sends detected signals to a controller (not shown in figures). The controller controls the valve (e.g. valve 55, FIG. 4A) to adjust the flow rate of the flow of gas F from the platen 32 and/or the platen 33 according the detected signals so as to adjust the height of the article 5. In some other embodiments, the closed-loop level control is conducted by adjusting the flow of gas F from the platen 32, and no flow of gas is provided from the platen 33.

Figure 6E:
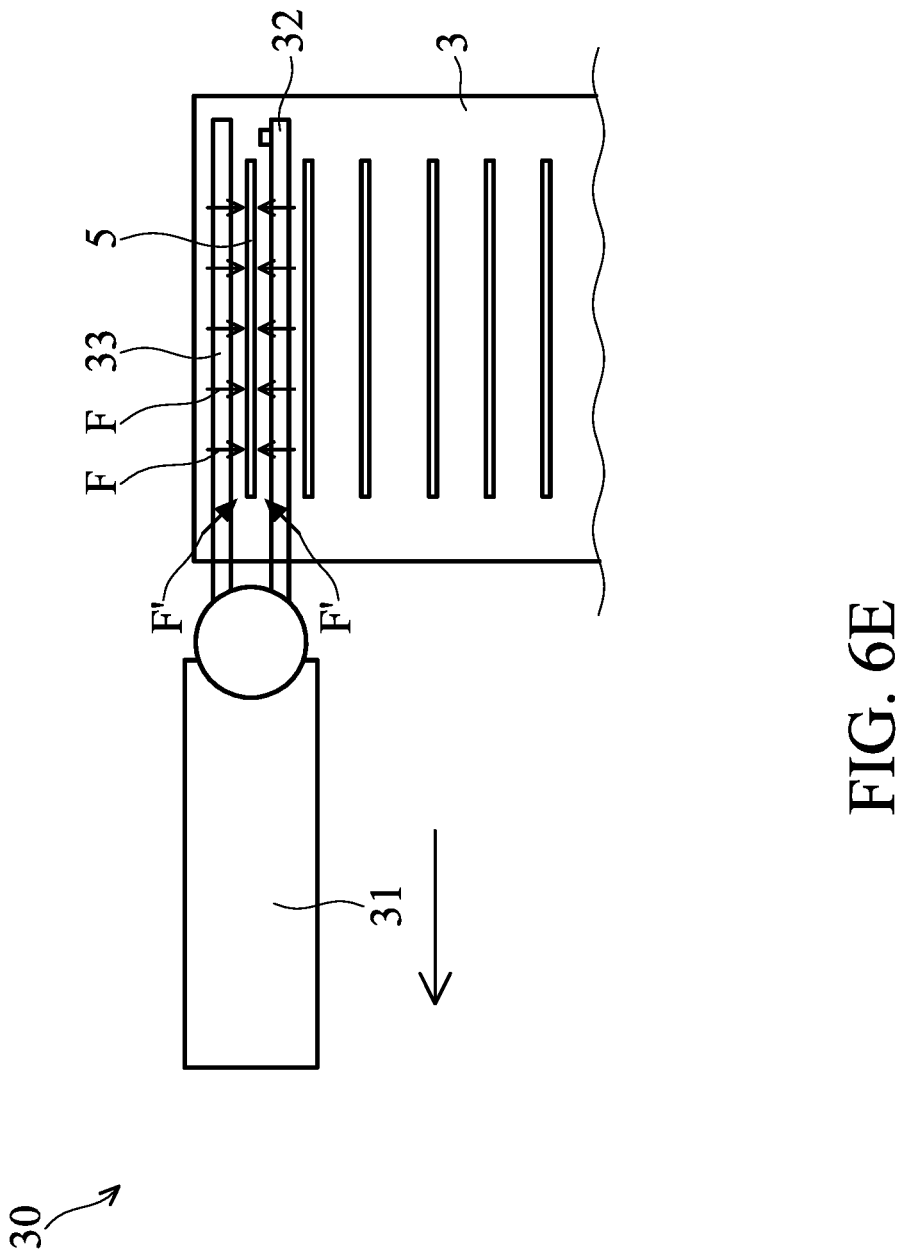
FIG. 6E shows a schematic view of one stage of a method for transferring an article as the article is removed from a container, in accordance with some embodiments.

After the height of the articles is stably positioned, the article 5 is removed from the carrier 3 along the direction indicated by the arrow in FIG. 6E. At the same time, another flow of gas F' is discharged from at least one of the platen 32 and the platen 33. The flow of gas F' is discharged toward the article 5 through the gas holes 61 (FIG. 4B). The flow of gas F' from the platen 32 and/or the platen 33 generates a lateral pneumatic force on the article 5 in an inclined direction. Therefore, the article 5 is kept within the gap G between the platen 32 and the platen 33 while the platens 32 and 33 are moved.

In the above embodiments, because the article 5 is not directly placed on the platens 32 and 33, the article 5 is prevented from being contaminated by particles on the platens 32 and 33. In addition, a breakage concern of article 5 due to collision of the platens 32 and 33 and other elements in the processing system 1 can be eased.

Figure 6F:
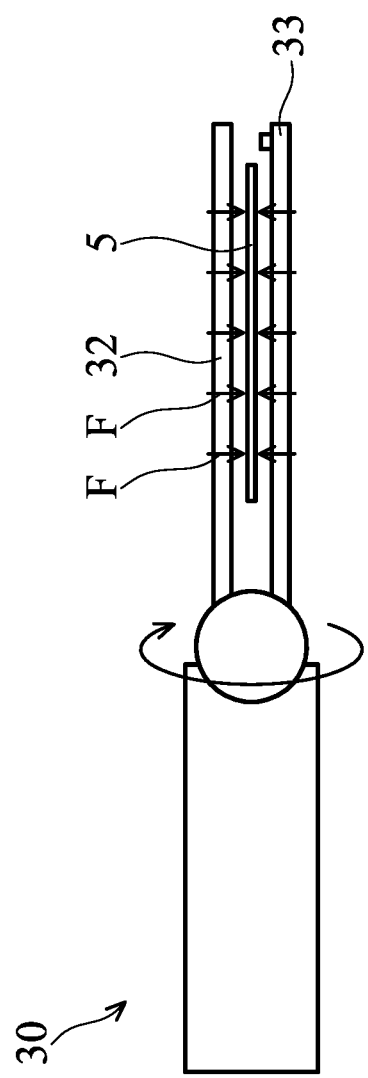
FIG. 6F shows a schematic view of one stage of a method for transferring an article as the article is rotated by a transporter, in accordance with some embodiments.

In some embodiments, as shown in FIG. 1, the article 5 is removed from the carrier 3 to the processing tool 10. Because the holding member 13 of the processing tool 10 is designed to hold the article 5 facing downwardly, a flipping process is performed before the article 5 moved to the processing tool 10. In the flipping process, the article 5 is rotated by the transporter 30 upside down, as shown in FIG. 6F. The rotation motion may be completed in 0.2 seconds or shorter, and the flow of gas F and/or the flow of gas F' are continuously supplied during the rotation motion. In some other embodiments, the flipping process is omitted when a processing tool for receiving the article 5 from the transporter 30 is designed to hold the article 5 facing upwardly.

Figure 6G:
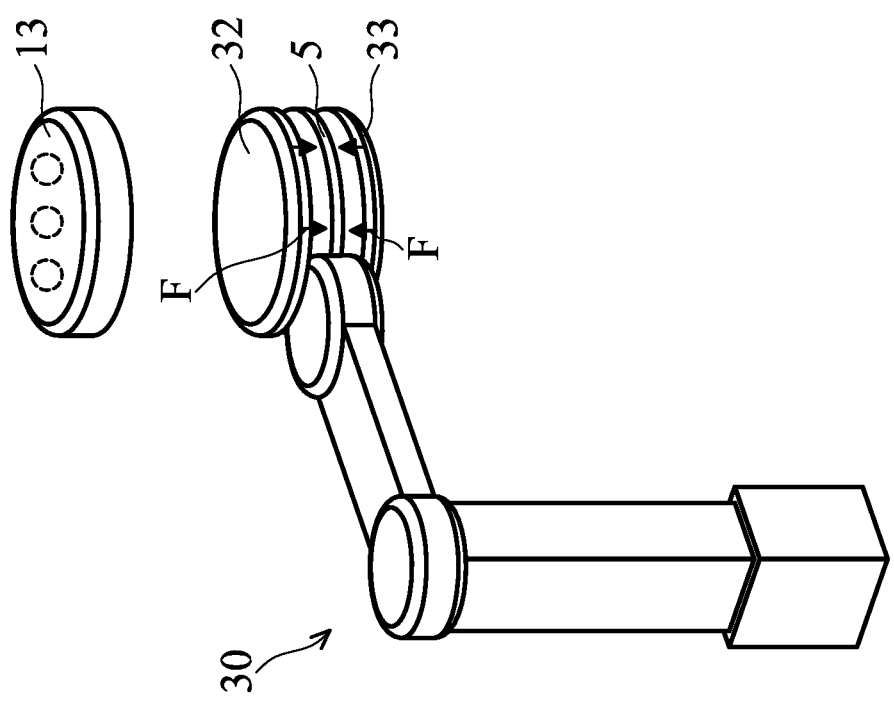
FIG. 6G shows a schematic view of one stage of a method for transferring an article as the article is moved next to a holding member, in accordance with some embodiments

As shown in FIG. 6G, the article 5 is moved to a destination position right below the holding member 13, with the platen 32 being positioned between the article 5 and the holding member 13. Afterwards, as shown in FIG. 6H, in order to unload the article 5 from the transporter 30 and place the article 5 on the holding member 13, the platen 32 is driven to rotate 180 degrees about the rotation axis R3 from a transferring position to a loading position, so as to allow the article 5 to face the holding member 13. In the transferring position, the inner surfaces of the two platens 32 and 33 face each other, and in the loading position, the two platens 32 and 33 are positioned offset from each other. At the same time, a vacuum V is created through the air passages 130 of the holding member 13 and the flow of gas F from the platen 33 is continuously discharged. The pneumatic force generated by the flow of gas F and the vacuum V move the article 5 toward the holding member 13 in a non-contact manner.

In some embodiments, the discharge of the flow of gas F from the platen 33 may be terminated when the article 5 is stably held by the holding member 13, as shown in FIG. 6I, and the transporter 30 may be moved to the carrier 3 (FIG. 1) or other position to handle other article.

Figure 7:
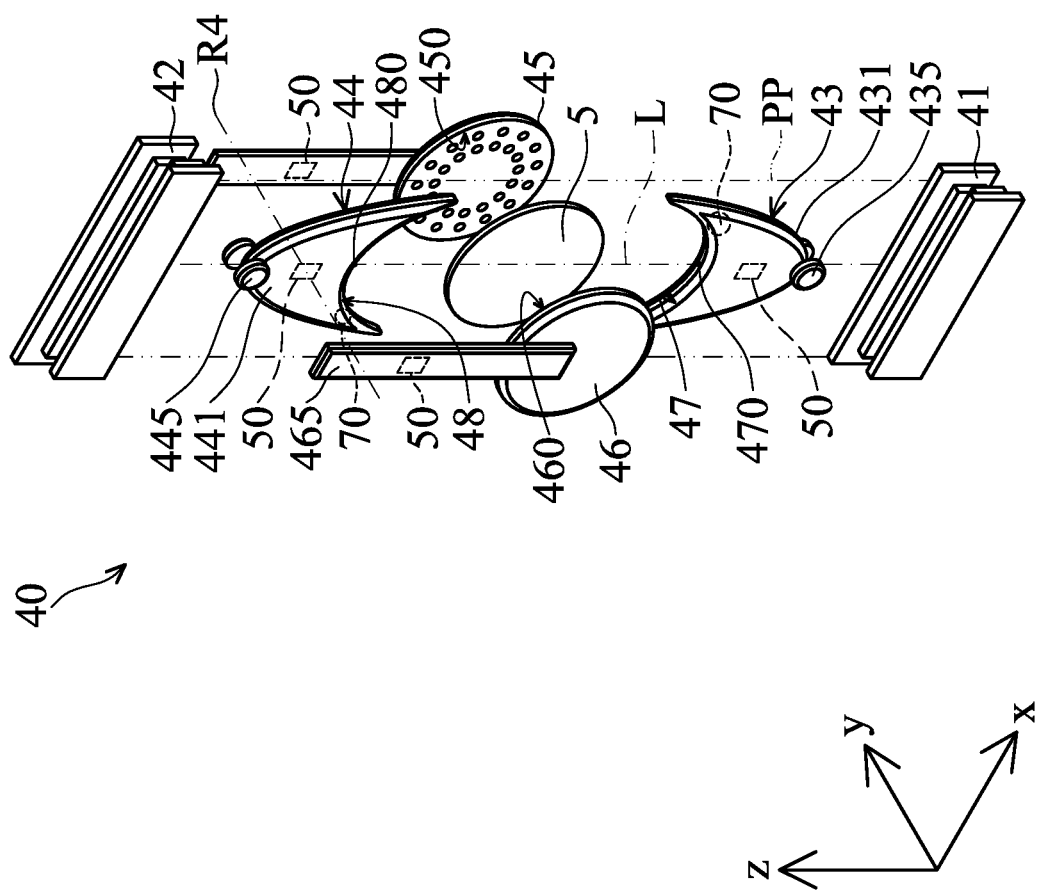
FIG. 7 shows an exploded view of a transporter, in accordance with some embodiments.

FIG. 7 shows an exploded view of a transporter 40, in accordance with some embodiments. In some embodiments, the processing apparatus 1 further includes a transporter 40. The transporter 40 is configured to transport the article 5 in an upright position (i.e., with the feature surface facing a horizontal direction.) In some embodiments, the transporter 40 includes a lower track 41, an upper track 42, a lower carriage 43, and an upper carriage 44.

The upper track 41, the lower carriage 43, the upper carriage 44 and the upper track 42 are arranged in order along the vertical direction Z. In some embodiments, the lower track 41 is configured to support the lower carriage 43, and the upper track 42 is configured to support upper carriage 44. The upper track 41 and the upper track 42 both have a guiding groove that is compatible with wheels 435 and 445 of the lower carriage 43 and the upper carriage 44 so as to guide the movement of the lower carriage 43 and upper carriage 44.

In some embodiments, the lower carriage 43 and the upper carriage 44 are arranged in a predetermined plane PP. The lower carriage 43 has a lateral surface 47, and the upper carriage 44 has a lateral surface 48. The lateral surface 47 directly faces the lateral surface 48 while the transporter 40 is vacant, and the lateral surface 47 and the lateral surface 48 are perpendicular to the predetermined plane PP.

Figure 8:
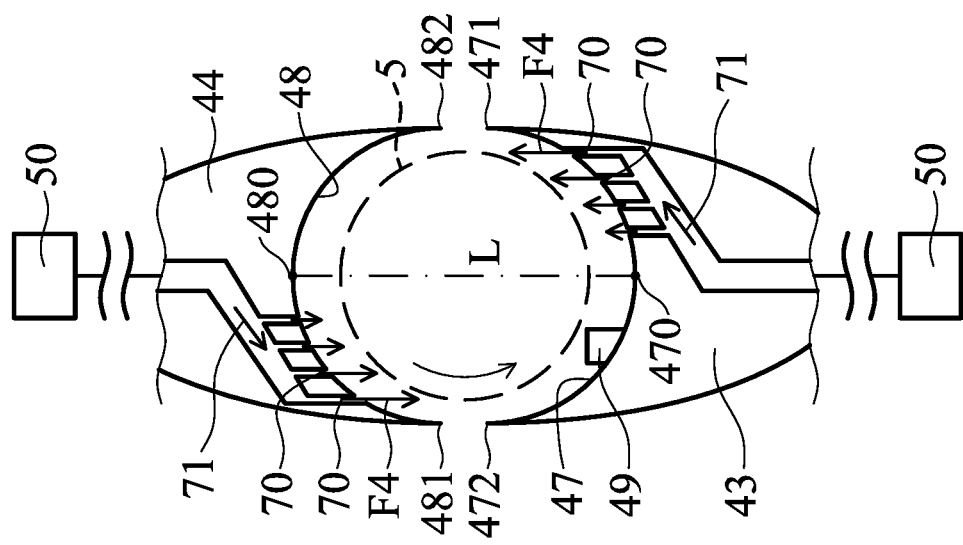
FIG. 8 shows a cross-sectional view of a lower carriage and an upper carriage on a predetermined surface, in accordance with some embodiments.

FIG. 8 shows a cross-sectional view of the lower carriage 43 and the upper carriage 44 on the predetermined surface PP, in accordance with some embodiments. In some embodiments, each of the lateral surface 47 and the lateral surface 48 has a curved cross section on the predetermined surface PP. The curvatures of the lateral surface 47 and the lateral surface 48 may be compatible with the curvature of an outer edge of the article 5 which is to be supported by the transporter 40. For example, the curvature of lateral surface 47 and that of lateral surface 48 includes partial segments of a circle in cases where a semiconductor wafer is transported by the transporter 40.

In some embodiments, the lateral surface 47 of the lower carriage 43 extends from a first end 471 to a second end 472, and the lateral surface 48 of the upper carriage 44 extends from a first end 481 to a second end 482. The first end 471 and the second end 482 face each other in the vertical direction Z. In addition, the second end 472 and the first end 481 face each other in the vertical direction Z. An axis L passes through two farthest points 470 and 480 of the lateral surfaces 47 and 48. The point 470 may be the center of the lateral surface 47, and the point 480 may be the center of the lateral surface 48. The axis L may be parallel to the vertical direction Z (FIG. 7). The two points 470 and 480 may be spaced apart by a distance of about 305 mm to about 315 mm, in cases where a 12-inch semiconductor wafer is transported by the transporter 40.

In some embodiments, there are a first group of gas holes formed on lateral surface 47 and lateral surface 48. The first group of gas holes is connected to the gas suppliers 50 positioned in the lower carriage 43 and the upper carriage 44 and configured to discharge a flow of gas from the gas suppliers 50 to the article 5.

Specifically, a portion of the first group of gas holes 70 is formed on the lateral surface 47, and the other portion of the first group of gas holes 70 is formed on the lateral surface 48. The gas holes 70 formed on the lateral surface 47 are located between the first end 471 and the point 470, and the gas holes 70 formed on the lateral surface 48 are located between the first end 481 and the point 480. In some embodiments, the first group of gas holes 70 are arranged symmetrically with respected to the axis L.

In some embodiments, there are no gas holes located between the point 470 and the second end 472 and between the point 480 and the second end 482. However, it should be appreciated that many variations and modifications can be made to embodiments of the disclosure. In some other embodiments, there are one or more gas holes 70 located between the point 470 and the second end 472 and between the point 480 and the second end 482.

In some embodiments, the gas holes 70 on the lateral surface 47 have different diameters. For example, in a direction away from the first end 471, widths of the gas holes 70 gradually decrease, and as such the gas hole 70 next to the first end 471 provides a flow of gas with a higher flow rate than the gas hole 70 next to the point 470. In addition, in a direction away from the first end 481, widths of the gas holes 70 gradually decrease, and as such the gas hole 70 next to the first end 481 provides a flow of gas with a higher flow rate than the gas hole 70 next to the point 480. In some embodiments, the largest gas hole 70 has a diameter in the range of about 7 mm to about 9 mm.

However, it should be appreciated that many variations and modifications can be made to embodiments of the disclosure. In some other embodiments, the gas holes 70 on the lateral surface 47 and the lateral surface 48 have uniform diameter, but the flow rate of the gas holes 70 are controller by regulators (such as valves, not shown in figures) to make the gas hole 70 next to the first ends 471 and 481 provide a flow of gas with a higher flow rate than the gas holes 70 next to the points 470 and 480.

The gas holes 70 on the lateral surface 47 are connected to the gas supplier 50 positioned in the lower carriage 43, and the gas holes 70 on the lateral surface 48 are connected to the gas supplier 50 positioned in the upper carriage 44. A conduit 71 may be formed in each of the lower carriage 43 and the upper carriage 44 to allow gas communication between the gas suppliers 50 and the gas holes 70.

Figure 9:
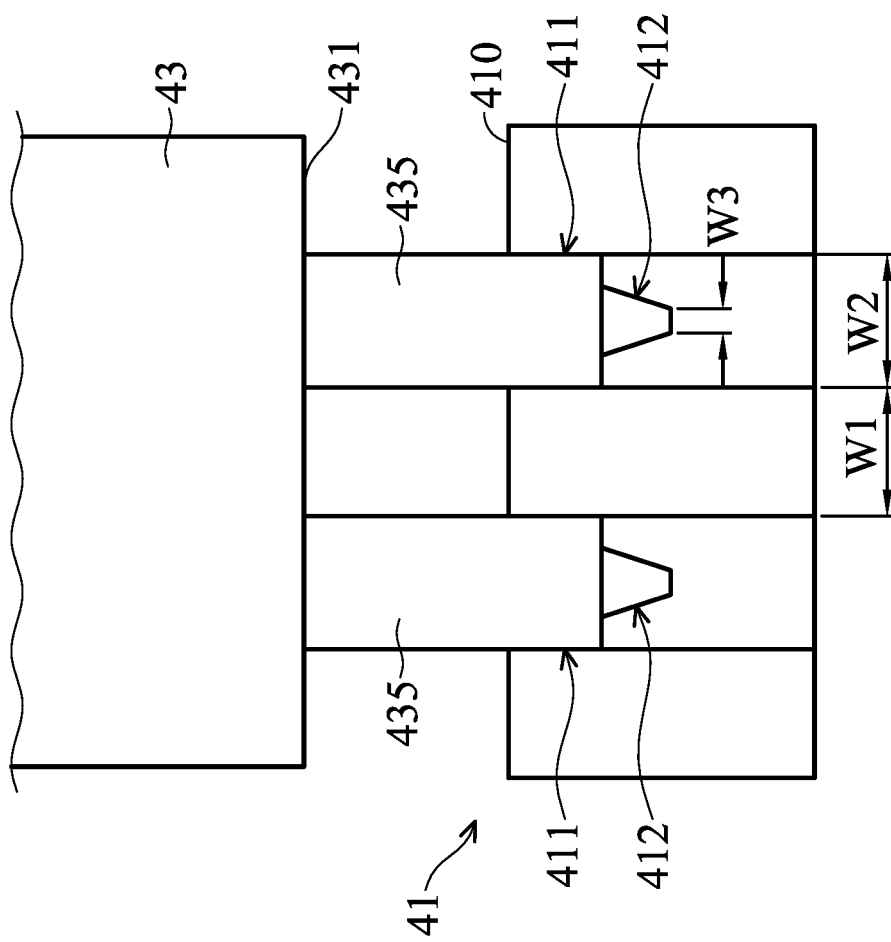
FIG. 9 shows a cross-sectional view of a track with a carriage positioned thereon, in accordance with some embodiments.

Referring back to FIG. 7, the lower track 41 and the upper track 42 are configured to guide the movement of the lower carriage 43 and the upper carriage 44. In some embodiments, each of the lower track 41 and the upper track 42 includes a guiding groove (FIG. 9 shows this feature more clearly) for allowing a sliding motion of wheels 435 and 445 of the lower carriage 43 and the upper carriage 44. The lower track 41 and the upper track 42 may be made of anti-corrosive material, such as polytetrafluoroethylene (PTFE), PEEK, or thermosetting plastic.

FIG. 9 shows a cross-sectional view of the lower track 41 with the lower carriage 43 positioned thereon, in accordance with some embodiments. In some embodiments, the lower track 41 includes two guiding grooves 411 formed on an upper surface 410 that face the lower carriage 43 with a space in the range of about 10 mm to about 14 mm formed there between. In addition, the lower carriage 43 includes two wheels 435 positioned at a side end 471 that is opposite to the lateral surface 47 (FIG. 7). The wheels 435 of the lower carriage 43 are positioned in the guiding grooves 411 and are movable along the guiding grooves 411. As a result, the movement of the lower carriage 43 is guided by the lower track 41.

In some embodiments, the lower track 41 further includes two draining grooves 412. The draining grooves 412 are connected to the two guiding grooves 411 and located beneath the guiding grooves 411. Each of the draining grooves 412 has a narrower width than the corresponding guiding groove 411. For example, each of the guiding grooves 411 has a width W2 of about 8 mm to about 10 mm. In addition, each of the draining grooves 412 has a width W3 in the range of about 4 mm to about 6 mm. The draining grooves 412 allows the convergence of the processing liquid, such as DI water, fall from the article 5 (FIG. 7). Therefore, the wheel 435 will smoothly roll in the guiding groove 411 without hindrance due to aggregation of the processing liquid in the guiding groove 411.

Referring back to FIG. 7, in some embodiments, the transporter 40 further includes a platen 45 and a platen 46. The platen 45 and the platen 46 are positioned at two sides of the predetermined plane PP and positioned between the lower carriage 43 and the upper carriage 44.

In some embodiments, the platen 45 has an inner surface 450 and the platen 46 has an inner surface 460 extending in width directions of the platens 45 and 46. The platen 45 and the platen 46 are positioned in such a way that the inner surfaces 450 of the platen 45 can be directly facing the inner surface 460 of the platen 46 with a spacing formed therebetween. The spacing may be slightly greater than a width of the lateral surface 47 in the horizontal direction Y, and the lateral surface 47 extends from the first end 471 to the second end 472 along the horizontal direction X (FIG. 8). The horizontal direction Y is perpendicular to the horizontal direction X. For example, the width of the lateral surface 47 in the direction Y is of about 10 mm to about 14 mm, and the platen 45 and the platen 46 are spaced by a distance in the range of about 12 mm to about 16 mm.

In some embodiments, the platen 45 and the platen 46 have the same configuration as the platen 32 described above. In addition, there are a second group of gas holes formed on the inner surface 450 of the platen 45 and the inner surface 460 of the platen 46. The second group of gas holes may be arranged on the inner surface 450 and the inner surface 460 as that of the gas holes 61, 62 and 63 formed on the inner surface 320 as shown in FIG. 3. Therefore, the features of the platen 45 and the platen 46 and the arrangements of the second group of gas holes will not be described in detail for the sake of brevity.

In some embodiments, the platen 45 and the platen 46 are connected to the upper carriage 44 via two brackets 465. The two brackets 465 may be pivotable connected to outer surfaces of the upper carriage 44, and one or more actuator (not shown in figures) are positioned in the upper carriage 44 for driving a rotation of the two brackets 465 about a rotation axis R4. Two gas suppliers 50 may be positioned in the two brackets 465 for supplying gas into the second group of gas holes formed on the platen 45 and the platen 46.

In some embodiments, there is a detector 49 positioned between the lower carriage 43 and the upper carriage 44. In the embodiment shown in FIG. 8, the detector 49 is placed on the lateral surface 470 of the lower carriage 43. The detector 49 is configured to detect a position of the article 5 in the transporter 40. The detector 49 may emit energy beam such as laser, sonar, or microwave, to the article 5 and receives a reflected energy beam from the article 5. Afterwards, the detector 49 calculates the distance between the article 5 and the detector 49 by multiplying the velocity of the energy beam and the traveling time of the energy beam. The detected results are sent to a controller (not shown in figures) for performing a closed-loop leveling control.

In some embodiments, as shown in FIG. 1, the article 5 is transferred from transporter 30 to the transporter 40 before the article 5 is processed by the processing tool 20. Stages of a method for transferring an article 5 from the transporter 30 to the transporter 40, in accordance with some embodiments, are shown in FIGS. 10A-10C.

Figure 10A:
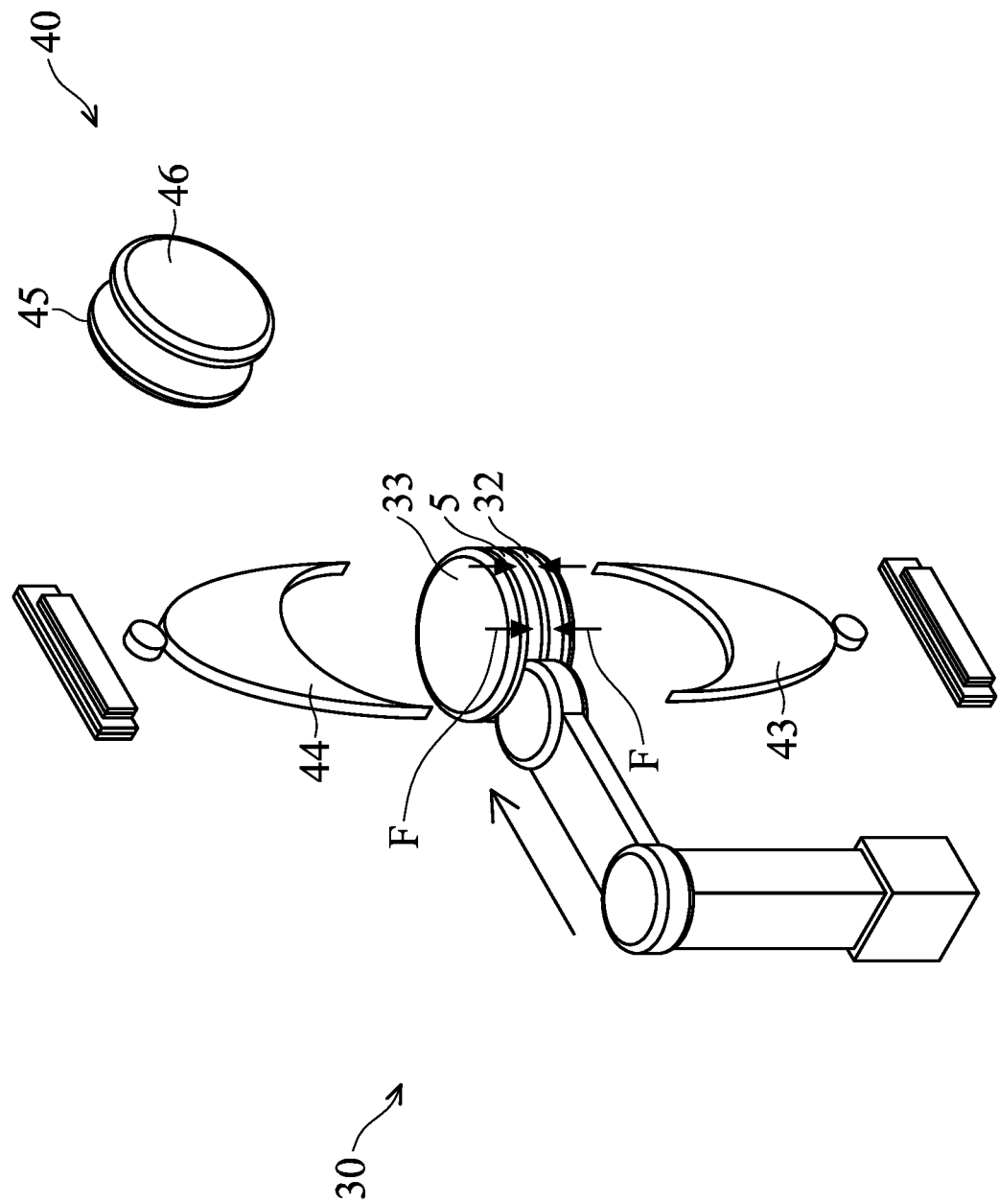
FIG. 10A shows a schematic view of one stage of a method for transferring an article as the article is moved between two carriages, in accordance with some embodiments.

As shown in FIG. 10A, to transfer the article 5 from the transporter 30 to the transporter 40, the article 5 is moved by the transporter 30 to a position between the lower carriage 43 and the upper carriage 44. Before the approaching of the article 5, the platen 45 and the platen 46 are lift to an idle position as shown in FIG. 10A to allow the insertion of the platen 32 and 33.

Figure 10B:
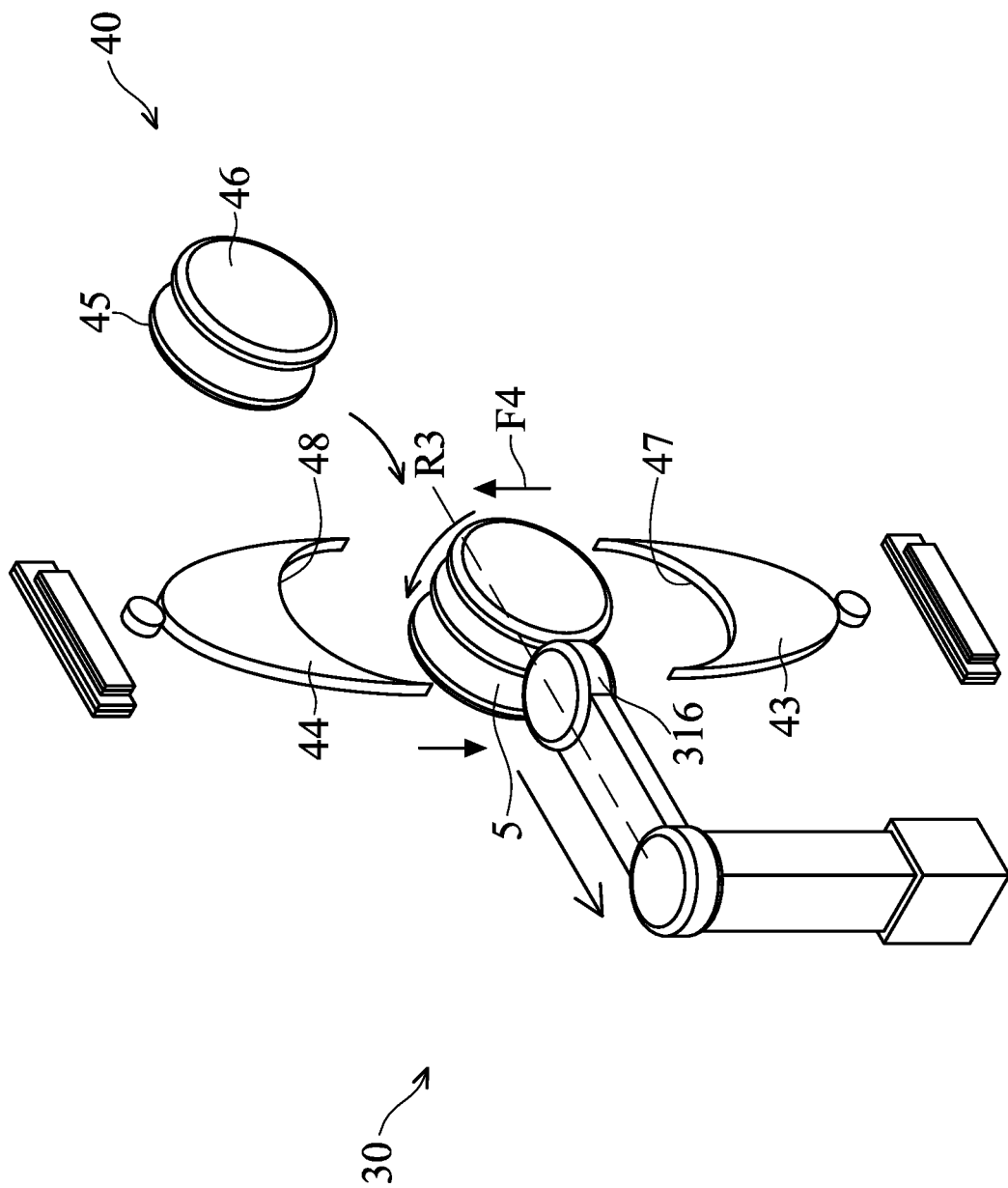
FIG. 10B shows a schematic view of one stage of a method for transferring an article as the article is rotated 90 degrees and suspend by the flow of gas from two carriages, in accordance with some embodiments.
Figure 10C:
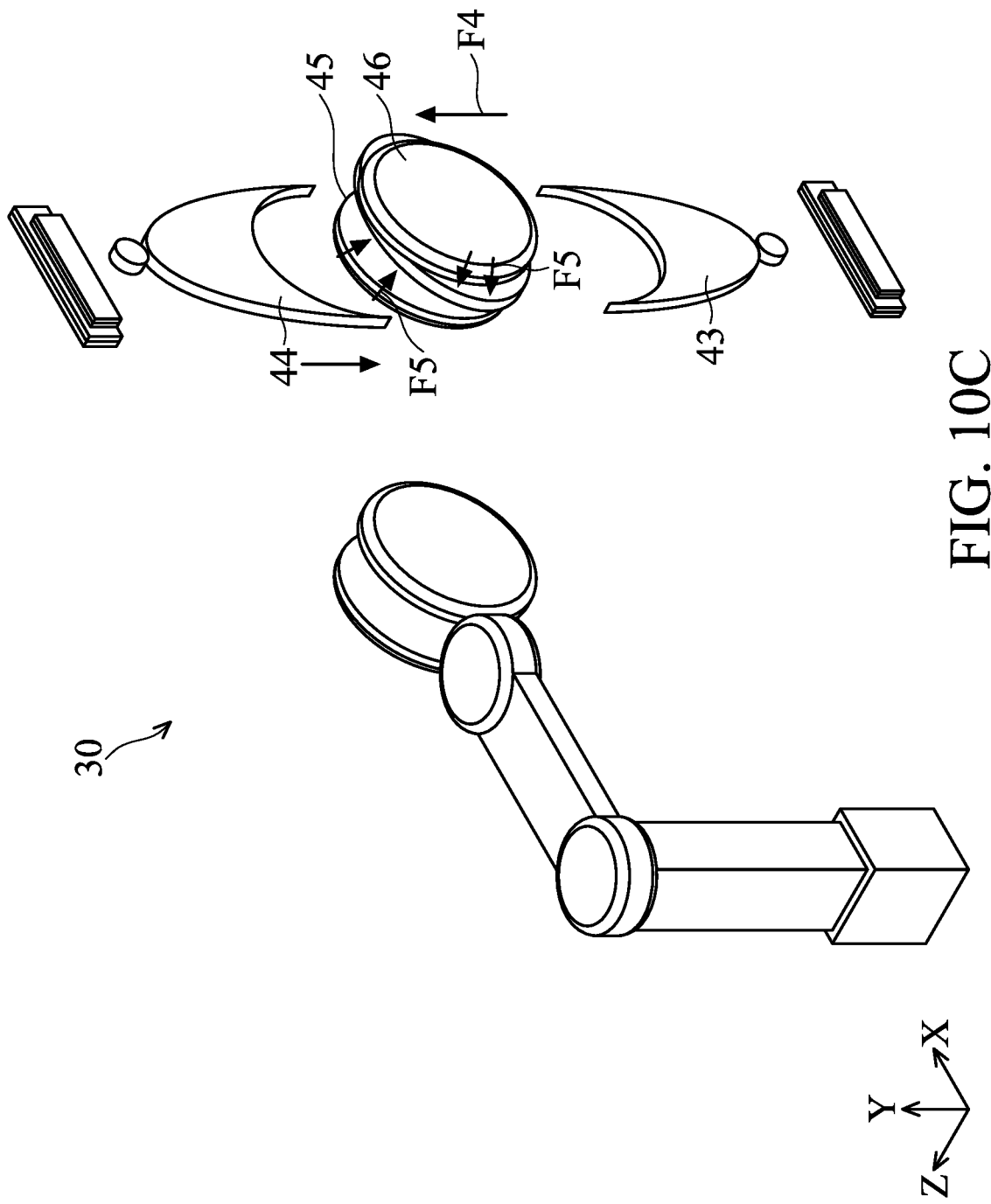
FIG. 10C shows a schematic view of one stage of a method for transferring an article as the article is suspend by the flow of gas from two carriages and two platens, in accordance with some embodiments.

Afterwards, as shown in FIG. 10B, the article 5 is rotated about the rotation axis R3 about 90 degrees by the joint 316 to allow the outer edge of the article 5 facing the lateral surface 47 and the lateral surface 48. At the same time, the flow of gas F4 is discharged from the lower carriage 43 and the upper carriage 44 apply the article 5.

In some embodiments, as shown in FIG. 8, the flow of gas F4 from the lower carriage 43 gradually decreases in a direction toward the point 470, and the flow of gas F4 from the upper carriage 44 gradually decreases in a direction toward the point 480. Therefore, the flow of gas F4 generates a pneumatic force to support the article 5 between the lower carriage 43 and the upper carriage 44 in a non-contact manner. In addition, the flow of gas F4 drives a rotation of the article 5 about an axis passing a feature surface of the article 5. In some embodiments, the pneumatic force generated by the flow of gas F4 from the lower carriage 43 and the upper carriage 44 satisfies equation $P=X*9.8 (kg*m/sec^2)*1.02$, where the P is the pneumatic force and X is the weight of the article 5.

In some embodiments, a closed-loop leveling control is carried out to stably suspend the article 5 at the predetermined position. Specifically, when the article 5 is suspended between the lower carriage 43 and the upper carriage 44, the detector 34 monitors the height of the article 5 relative to the lower carriage 43 and sends detected signals to a controller (not shown in figures). The controller adjust the flow rate of the flow of gas F4 from the lower carriage 43 and/or the upper carriage 44 according the detected signals so as to adjust the height of the article 5.

Afterwards, as shown in FIG. 10C, the platens 32 and 33 are replaced with the platens 45 and 46 by lowering down the platen 45 and the platen 46 to a position next to the article 5. When the article 5 is positioned between the platens 45 and 46, the flow of gas F5 is generated by the platen 45 and the platen 46 so as to control the position of the reticle in the direction X and in the direction Y. The flow of gas F5 may apply force on the article in a direction that is normal to the feature surface, and/or apply force on the article 5 in a direction that is inclined to the feature surface of the article 5 as the flow of gas shown in FIG. 6E.

Figure 10D:
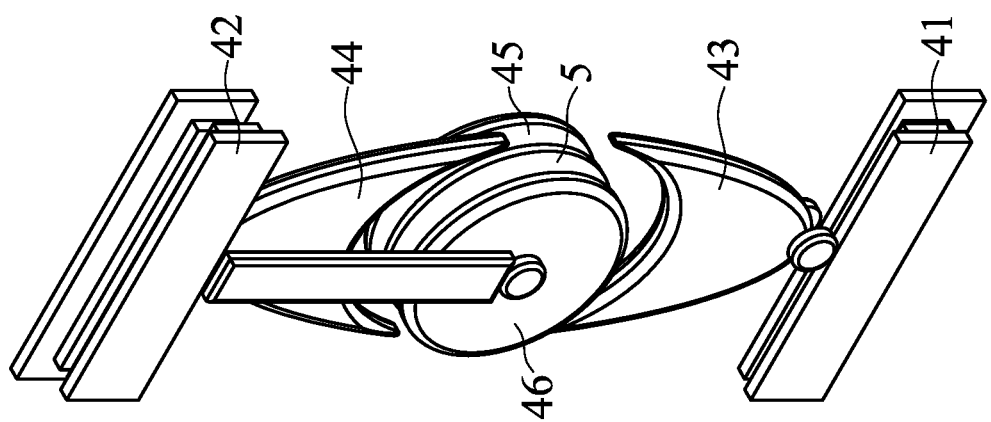
FIG. 10D shows a schematic view of one stage of a method for transferring an article as the article is moved by a transporter along a track, in accordance with some embodiments.

Afterwards, as shown in FIG. 10D, the lower carriage 43, the upper carriage 44 are moved along the lower track 41 and the upper track 42 to transfer the article 5 to next destination, such as the processing tool 20 (FIG. 1). During the transfer of the article 5, the flow of gas is continuously provided by the lower carriage 43, the upper carriage 44, the platen 45 and the platen 46 to control the position of the article 5 in the transporter 40.

In some embodiments, a closed-loop leveling process as described above can be conducted to limit the position of the article 5 in the transporter 40. In some embodiments, during the transfer of the article 5, gaps between the article 5 and the lower carriage 43 or the upper carriage 44 is controlled in the range from about 4 mm to about 6 mm, and gaps between the article 5 and the platen 45 and the platen 46 is controlled in the range from about 4 mm to about 7 mm.

Embodiments of a method for transferring article used in semiconductor fabrication are provided. Improvement of a transporter for transferring the article allows a non-contact transferring process and hence improves the product yield of the semiconductor device because possibility of contamination is prevented and reduces the manufacturing cost because of wafer scrap reduction.

In accordance with some embodiments, a method for transporting an article used in semiconductor fabrication is provided. The method includes moving a first transporter next to an article to have the article faces a plurality of gas holes formed on the first transporter. The method further includes suspending the article with the first transporter in a non-contact manner by providing a flow of gas through the gas holes of the first transporter. The method also includes transferring the article with the first transporter while the flow of gas is continuously provided.

In accordance with some embodiments, a transporter used for transporting an article in semiconductor fabrication is provided. The transporter includes a robotic arm. The transporter further includes two platens connected to the robotic arm. Each of the two platens an inner surface facing the other, and a number of gas holes are formed on each of the inner surfaces of the two platens. The transporter also includes a gas supplier placed in communication with the gas holes. The gas supplier is used to control the flow of gas through the gas holes.

In accordance with some embodiments, a transporter used for transporting an article used in semiconductor fabrication is provided. The transporter includes an upper carriage and a lower carriage arranged in a predetermined plane. Each of the upper carriage and the lower carriage has a lateral surface facing the other, and a first group of gas holes is formed on each of the lateral surfaces of the upper carriage and the lower carriage. The transporter further includes a lower track configured to facilitate movement of the lower carriage. The transporter also includes an upper track configured to facilitate movement of the upper carriage. In addition, the transporter includes a number of gas suppliers placed in communication with the first group of gas holes and the second group of gas holes. The gas suppliers are used to control a flow of gas through the first group of gas holes and the second group of gas holes.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for transporting an article used in semiconductor fabrication, comprising:

moving a first transporter next to an article to have the article face a plurality of gas holes formed on the first transporter;
suspending the article with the first transporter in a non-contact manner by providing a flow of gas through the gas holes of the first transporter;
transferring the article with the first transporter while the flow of gas is continuously provided;
detecting a position of the article in the first transporter; and
controlling the flow of gas through the gas holes according to the position of the article; and
providing another flow of gas through the first group of gas holes of the second transporter to suspend the article is a non-contact manner.

2. The method as claimed in claim 1, wherein the flow of gas is simultaneously discharged toward the article through the gas holes formed on two platens of the first transporter that face each other.

3. The method as claimed in claim 1, wherein the transfer of the article comprises moving the article to a predetermined position where a holding member is located, and the method further comprises:
creating a vacuum force by providing another flow of gas through a plurality of gas holes formed on the holding member to remove the article from the first transporter.

4. The method as claimed in claim 1, further comprising:
moving the platens of the second transporter along a lower track and an upper track of the second transporter, wherein the platens are each connected to the upper track via a bracket.

5. The method as claimed in claim 1, wherein the flow of gas from the first group of the gas holes of the second transporter gradually decreases towards a center of a lower carriage and an upper carriage of the second transporter.

6. The method as claimed in claim 1, further comprising:
positioning a gas supplier in a lower carriage and an upper carriage facing edge of the article for discharging the flows of gas.

7. The method as claimed in claim 1, wherein the article comprises a semiconductor wafer or a photomask used for a lithography exposure process.

8. The method as claimed in claim 1, further comprises:
removing the first transporter; and
moving two platens of the second transporter next to the article to have a second group of gas holes formed on the two platens of the second transporter face the article;
providing another flow of gas through the second group of gas holes; and
transferring the article with the second transporter while the flows of gas through the first group of gas holes and the second group of gas holes are continuously provided.

9. A method for transporting an article used in semiconductor fabrication, comprising:
positioning an article between two carriages of a transporter;
rotating the article to have an edge of the article face the carriages of transporter;
suspending the article in a non-contact manner by providing a flow of gas from the carriages of the transporter; and
moving the platens of the transporter along a lower track and an upper track of the transporter, wherein the platens are each connected to the upper track via a bracket.

10. The method as claimed in claim 9, further comprising:
moving two platens of the transporter from an idle position to a position next to the article, and
providing another flow of gas from the platens of the transporter to the article.

11. The method as claimed in claim 10, wherein the flow of gas from the platens is provided while the flow of gas from the carriages is continuously provided.

12. The method as claimed in claim 9, further comprising:
collecting a processing liquid from the article by a draining groove disposed in the lower track, wherein a width of the draining groove gradually decreases from a top of the draining groove.

13. The method as claimed in claim 9, further comprising:
generating a pneumatic force to support the article between the carriages by gradually decreasing the flow of gas towards a center of the carriages of the transporter.

14. A method for transporting an article used in semiconductor fabrication, comprising:
moving a first transporter next to an article to have the article face a plurality of gas holes formed on the first transporter;
suspending the article with the first transporter in a non-contact manner by providing a flow of gas through the gas holes of the first transporter;
transferring the article with the first transporter while the flow of gas is continuously provided, wherein the transfer of the article comprises rotating the article by the first transporter to have an edge of the article face a first group of gas holes of a second transporter; and
providing another flow of gas through the first group of gas holes of the second transporter to suspend the article in a non-contact manner.

15. The method as claimed in claim 14, further comprises:
removing the first transporter; and
moving two platens of the second transporter next to the article to have a second group of gas holes formed on the two platens of the second transporter face the article;
providing another flow of gas through the second group of gas holes; and
transferring the article with the second transporter while the flows of gas through the first group of gas holes and the second group of gas holes are continuously provided.

16. The method as claimed in claim 14, wherein the article comprises a semiconductor wafer or a photomask used for a lithography exposure process.

17. The method as claimed in claim 14, further comprising:
moving the platens of the second transporter along a lower track and an upper track of the second transporter, wherein the platens are each connected to the upper track via a bracket.

18. The method as claimed in claim 14, wherein the flow of gas from the first group of the gas holes of the second transporter gradually decreases towards a center of a lower carriage and an upper carriage of the second transporter.

19. The method as claimed in claim 14, further comprising:
positioning a gas supplier in a lower carriage and an upper carriage facing edge of the article for discharging the flows of gas.

20. The method as claimed in claim 19, further comprising:

generating a pneumatic force to support the article between the lower carriage and the upper carriage by gradually decreasing the flow of gas towards a center of the carriages of the transporter.

* * * * *